US006756849B2

(12) United States Patent
Dupuis et al.

(10) Patent No.: US 6,756,849 B2
(45) Date of Patent: Jun. 29, 2004

(54) ABSOLUTE POWER DETECTOR

(76) Inventors: Timothy J. Dupuis, 3208 Forth Worth Trail, Austin, TX (US) 78748; David R. Welland, 112 W. 32nd St., Austin, TX (US) 78705; Susanne A. Paul, 7901 Bricklebush Cove, Austin, TX (US) 78750; Ali M. Niknejad, 3001 Derby St. Unit G, Berkeley, CA (US) 94705

( * ) Notice: Subject to any disclaimer, the term of this patent is extended or adjusted under 35 U.S.C. 154(b) by 0 days.

(21) Appl. No.: 10/673,749

(22) Filed: Sep. 29, 2003

(65) Prior Publication Data

US 2004/0070453 A1 Apr. 15, 2004

Related U.S. Application Data

(63) Continuation-in-part of application No. 09/842,456, filed on Apr. 26, 2001, which is a continuation-in-part of application No. 09/660,123, filed on Sep. 12, 2000, now Pat. No. 6,549,071.

(51) Int. Cl.[7] ................................................ H03G 3/10
(52) U.S. Cl. ....................... 330/279; 330/199; 330/127; 330/96; 330/102

(58) Field of Search ................................. 330/279, 254, 330/149, 199, 297, 127, 96, 75, 102

(56) References Cited

U.S. PATENT DOCUMENTS 6,677,821 B2 * 1/2004 Kusunoki et al. ........... 330/149

FOREIGN PATENT DOCUMENTS

JP          637011         * 1/1988

OTHER PUBLICATIONS

Berglund "A note On Power–Law Devices and Their Effect on Signal–to–Noise Ratio" IEEE Transactions on Information Theory vol. 10, Issue 1, Jan. 1964 52–57.*

* cited by examiner

Primary Examiner—Michael B. Shingleton
(74) Attorney, Agent, or Firm—Johnson & Associates

(57) ABSTRACT

A method and apparatus is provided for detecting the output power of a power amplifier. The output power is detected by detecting the absolute values of the voltage and current at the output of the amplifier and mixing the detected voltage and current to generate a signal related to the output power.

20 Claims, 20 Drawing Sheets

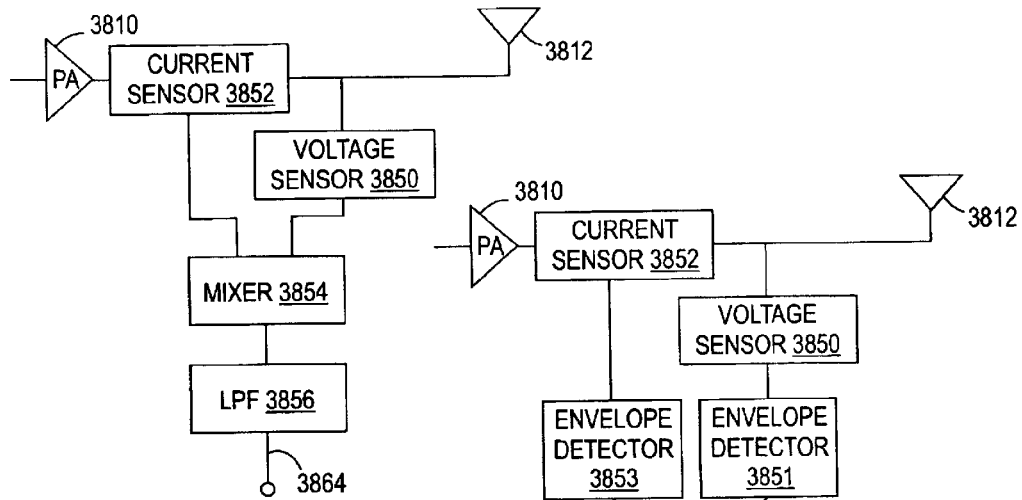
FIG.38
FIG.39
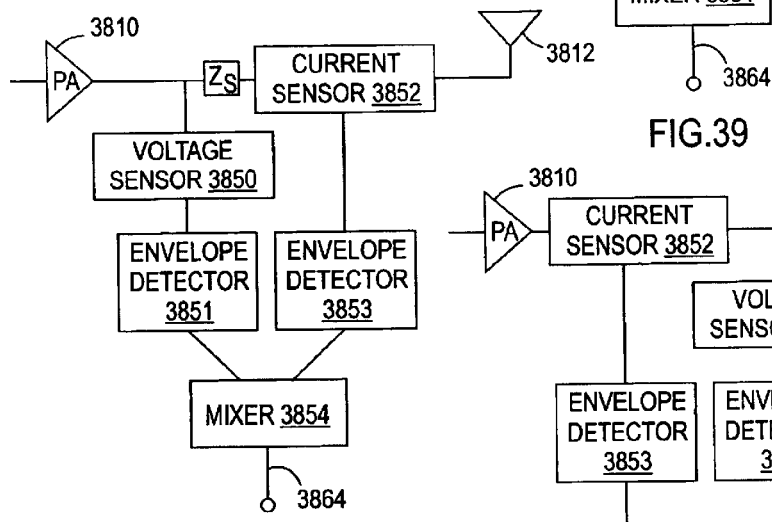
FIG.40
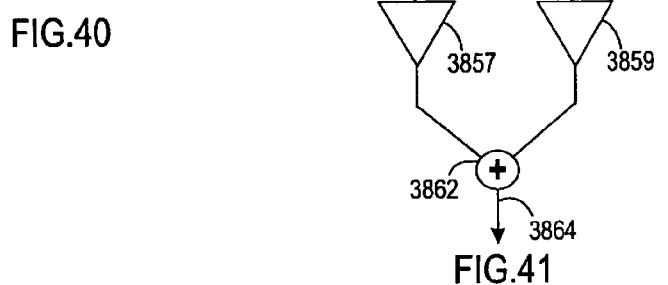
FIG.41

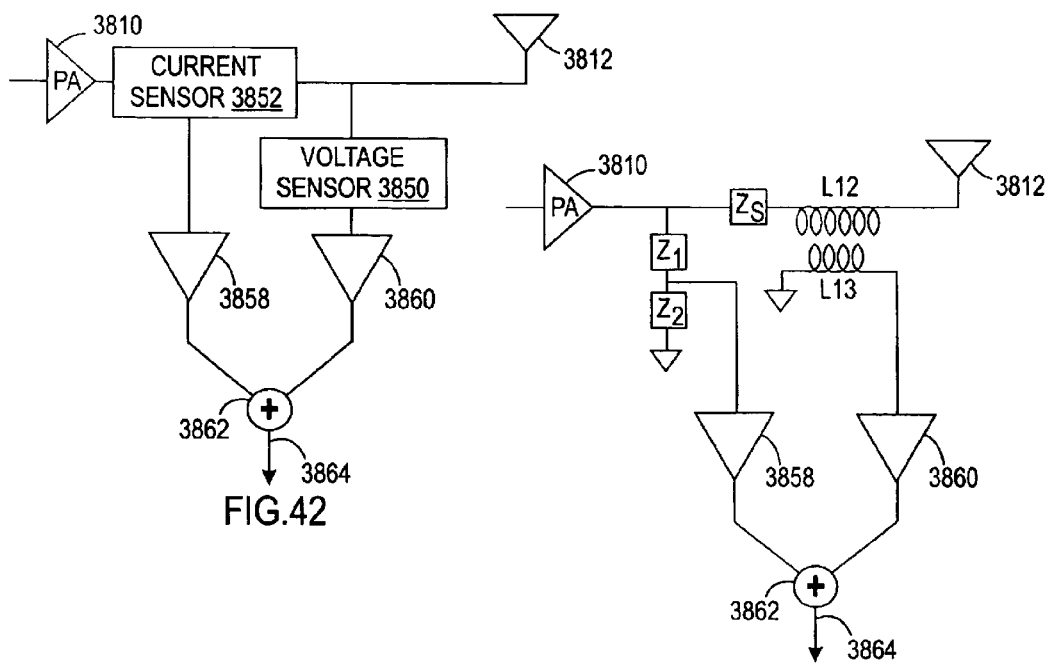
FIG.42
FIG.43
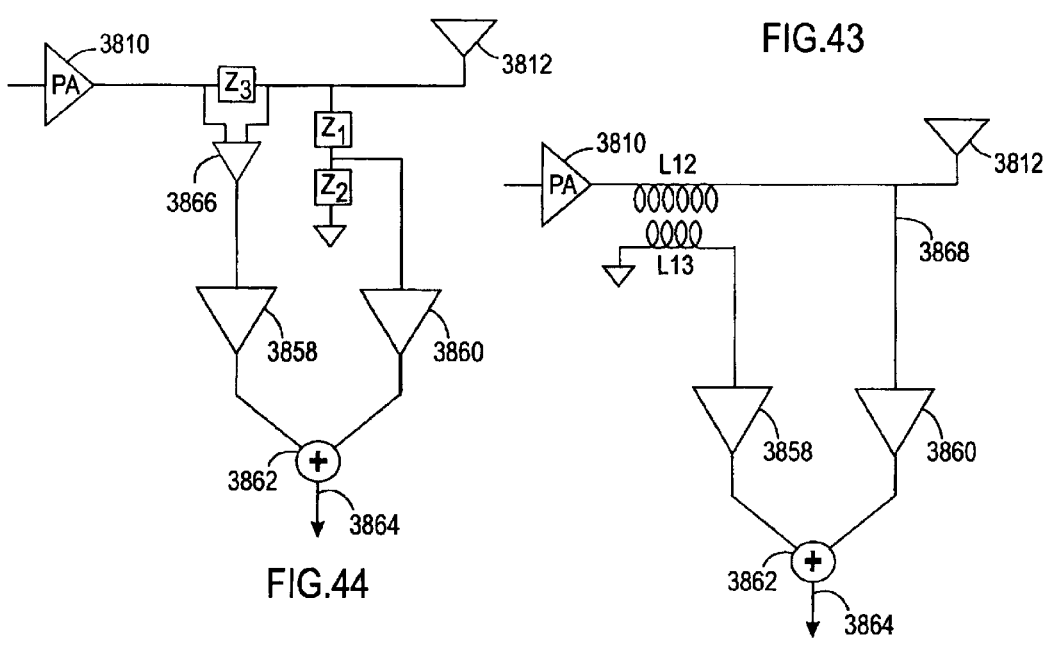
FIG.44
FIG.45

ABSOLUTE POWER DETECTOR

CROSS REFERENCE TO RELATED APPLICATIONS

This application is a continuation-in-part of U.S. application Ser. No. 09/842,456, filed on Apr. 26, 2001, entitled "RF POWER DETECTOR", which is a continuation-in-part of U.S. application Ser. No. 09/660,123, filed on Sep. 12, 2000 now U.S. Pat. No. 6,549,071, entitled "POWER AMPLIFIER CIRCUITRY AND METHOD".

FIELD OF THE INVENTION

This invention relates to the field of power amplifiers. More particularly, this invention relates to circuitry for detecting the output power of an RF power amplifier.

BACKGROUND OF THE INVENTION

In some applications utilizing a power amplifier, it is desirable to limit the peak voltage that the switching devices of the power amplifier are subjected to. For example, in CMOS devices, the transistor breakdown voltage may be only slightly greater than the supply voltage. Therefore, CMOS devices are not well suited to traditional power amplifier designs, where switching devices are subjected to voltages at least twice the supply voltage.

FIG. 1 is a schematic diagram of a conventional Class E amplifier. As shown, a transistor M1 is connected between ground and an inductor L1 which is connected to a voltage source $V_{dd}$. The gate of the transistor M1 is connected to an input signal Vi. The connection of the transistor M1 and the inductor L1 forms a node labeled Vd. The switching device M1, as well as other switching devices described may be comprised of any suitable switching devices, for example, MOSFETs or other transistor types. A capacitor C1 is connected between Vd and ground. The amplifier includes a transformation network consisting of inductor L2 and capacitor C2. The capacitor C2 is connected to a load $R_L$ at output node $V_o$.

FIG. 2 is a timing diagram illustrating the input signal Vi and the resulting voltage at Vd. As shown, the input signal Vi is a square wave signal switching between ground and $V_{dd}$. When the input signal Vi is high ($V_{dd}$), the transistor M1 is turned on, holding Vd to ground. When the input signal Vi transitions to low, transistor M1 turns off and the voltage at Vd rises above $V_{dd}$. During this time, the transistor M1 must sustain this high drain-to-source voltage. After peaking, the voltage at Vd decreases until it reaches ground. In a typical prior art Class E design, this peak voltage is approximately 3.6 $V_{dd}$. Although the peak voltage can be reduced slightly, it can not be decreased below about 2.5 $V_{dd}$ since the average voltage at Vd must equal $V_{dd}$. Designs such as that shown in FIG. 1 are not well suited to certain device technologies, such as CMOS, where transistor breakdown voltages are only slightly higher than the supply voltage.

It can therefore be seen that there is a need for amplifier designs where the peak voltages applied to the transistors of the amplifier are reduced so that they are below the transistor breakdown voltages of the devices being used to implement the design.

Another problem relating to amplifiers relates to the use of differential circuits. It is difficult to perform differential-to-single-ended conversion when a single ended load is required with high efficiency. Therefore, there is a need for improved differential-to-single-ended conversion designs.

Another problem relating to amplifiers relates to detecting the output power of an amplifier for purposes of controlling the output power of the amplifier. For example, in a power regulation circuit for a cellular telephone power amplifier, there is a need to sense the power delivered to the antenna. The sensed power is used to help control the output power of the power amplifier. One problem with detecting the output power of an amplifier results when there is an unknown load on the amplifier. This problem may be worse when the load is a radiating antenna since direct power measurement through thermal analysis is not possible.

SUMMARY OF THE INVENTION

A power detector is provided for detecting the output of a power amplifier comprising: a voltage sensor coupled to the power amplifier for sensing the voltage provided to the output of the power amplifier; a first envelope detector coupled to the voltage sensor; a current sensor coupled to the power amplifier for sensing the current provided to the output of the power amplifier; a second envelope detector coupled to the current sensor, a mixer coupled to first and second envelope detectors for generating an output signal from the sensed voltage and sensed current that is related to the output power of the power amplifier.

Another embodiment of the invention provides a method of detecting the output power of a power amplifier comprising the steps of: sensing the magnitude of the voltage at the output of the power amplifier; sensing the magnitude of the current at the output of the power amplifier; and generating a signal using the sensed output voltage and sensed output current, wherein the generated signal is proportional to the output power of the power amplifier.

Another embodiment of the invention provides a method of controlling the output power of an RF power amplifier comprising the steps of: generating a first signal that is proportional to the magnitude of the voltage at the output of the RF power amplifier; generating a second signal that is proportional to the magnitude of the current at the output of the RF power amplifier, generating a power control signal based on the first and second signals; and using the power control signal to control the output power of the RF power amplifier.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIGS. 38–46 are diagrams of circuits for detecting the output power of a power amplifier.

DETAILED DESCRIPTION

In order to provide a context for understanding this description, the following illustrates a typical application of the present invention. A power amplifier of the present invention may be used as an amplifier for use with a wireless transmission system such as a wireless telephone or other device. The invention may also be applied to other applications, including, but not limited to, RF power amplifiers. In a wireless device such as a cellular telephone, the device may include a transceiver, an antenna duplexer, and an antenna. Connected between the transceiver and the antenna duplexer is an RF power amplifier for amplifying signals for transmission via the antenna. This is one example of an application of a power amplifier of the present invention. Of course the invention may be used in any other application requiring a power amplifier. In the case of a wireless telephone application, the invention may be applied to GSM or other constant envelope modulation systems.

Figure 1:
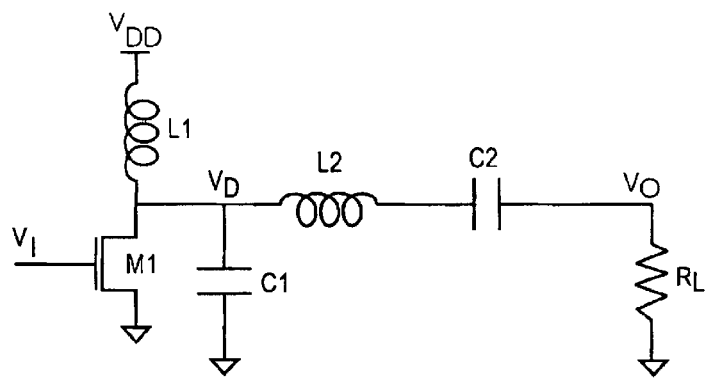
FIG. 1 is a schematic diagram of a prior art Class E amplifier.
Figure 2:
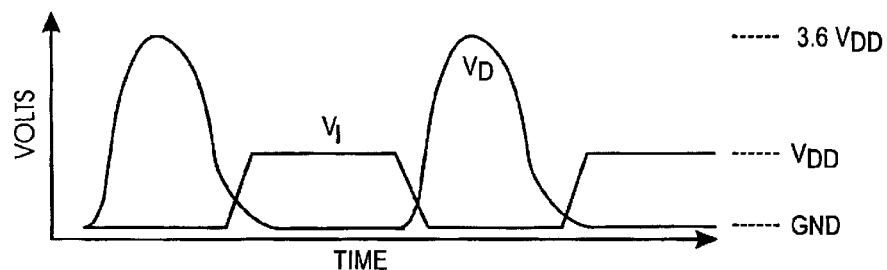
FIG. 2 is a timing diagram illustrating the voltage at $V_D$ relative to the input signal $V_I$ for the prior art Class E amplifier shown in FIG. 1.
Figure 3:
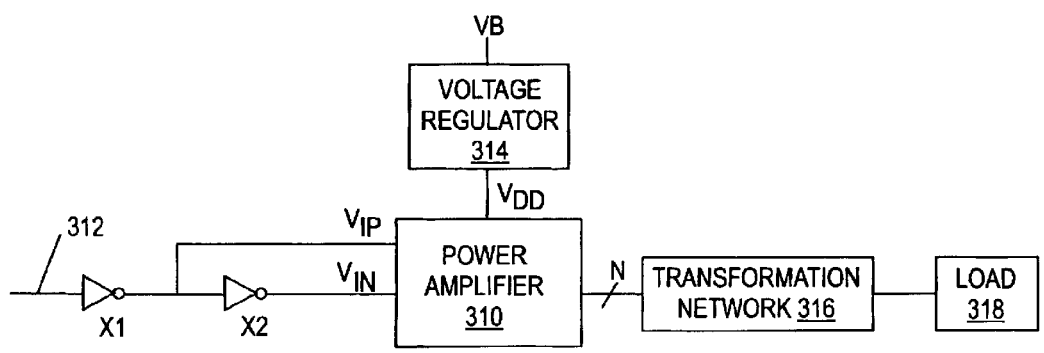
FIG. 3 is a block diagram illustrating an example of an environment in which a power amplifier of the present invention may be used.

FIG. 3 is a block diagram illustrating an example of an environment in which a power amplifier of the present invention may be used FIG. 3 shows a power amplifier connected to a pair of input signals $V_{in}$ and $V_{ip}$. The input signals come from an input 312 from an input network such as the transceiver chip mentioned above. An input buffer is formed by a plurality of inverters X1 and X2 which are connected to the input 312 as shown. The input buffer circuit could also be comprised of more or less inverters, or any other suitable circuitry. The power amplifier 310 is also connected to a voltage regulator 314 which provides a regulated voltage source $V_{dd}$ from a voltage source, such as battery voltage VB. The power amplifier 310 is also connected to a transformation network 316 which is connected to a load 318. Note that the connection between power amplifier 310 and the transformation network 316 may be comprised of a single or multiple connections. FIG. 3 is shown with n connections. In the example of a wireless transmission system, the load 318 may be comprised of an antenna. Note that the components shown in FIG. 3 are optional and are not essential to the power amplifier 310.

Figure 4:
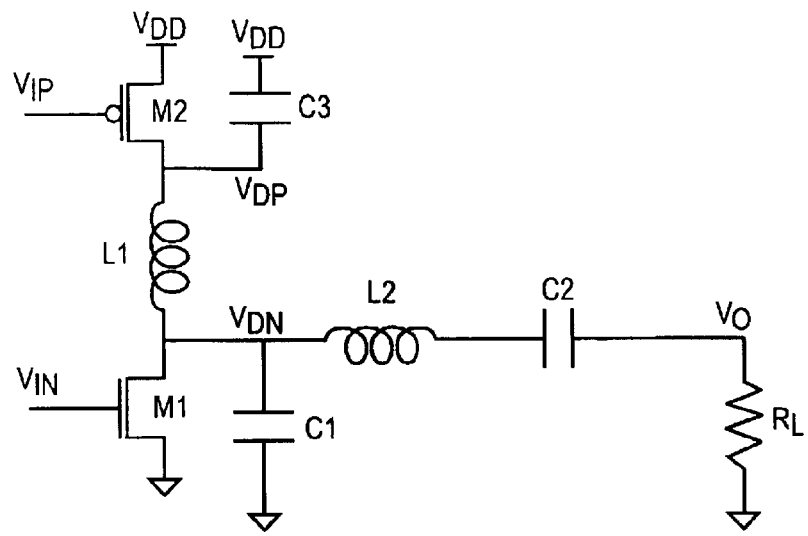
FIG. 4 is a schematic diagram of one embodiment of a power amplifier of the present invention.

FIG. 4 is a schematic diagram of one embodiment of a power amplifier of the present invention. The power amplifier includes a switching device M1 connected between ground and the node labeled $V_{dn}$. The gate of the switching device M1 is connected to the input signal $V_{in}$. Another switching device M2 is connected between the voltage source $V_{dd}$ and a node labeled $V_{dp}$. The gate of the switching device M2 is connected to the input signal $V_{ip}$. Connected between the switching devices M2 and M1 is an inductor L1. FIG. 4 also shows a capacitor C1 connected between $V_{dn}$ and ground. A capacitor C3 is connected between $V_{dp}$ and $V_{dd}$. The capacitors C1 and C3 may be comprised of a combination of separate capacitors and parasitic capacitances of the switching devices M1 and M2. The power amplifier shown in FIG. 4 also includes a reactive network connected between $V_{dn}$ and the amplifier output $V_o$. The reactive network is formed by inductor L2 and capacitor C2 and can be used for filtering or impedance transformation. A load $R_L$ is connected to the amplifier output $V_o$.

Figure 5:
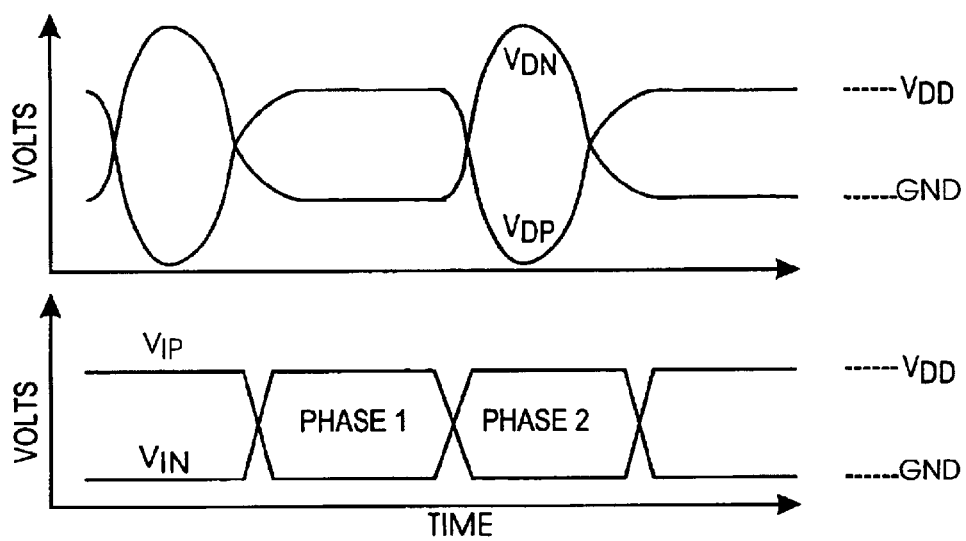
FIG. 5 is a timing diagram illustrating the voltages present in the amplifier shown in FIG. 4, relative to the input signals.

The power amplifier shown in FIG. 4 resembles a push-pull amplifier topologically, but is fundamentally different, in that the input signals $V_{in}$ and $V_{ip}$ are inverses of one another. Since switching device M1 is an n-channel device and switching device M2 is a p-channel device, the switching devices M1 and M2 are both turned on and turned off during the same time intervals. FIG. 5 is a timing diagram illustrating the voltages present in the amplifier shown in FIG. 4, relative to the input signals. FIG. 5 shows the input signals $V_{in}$ and $V_{ip}$ which are 180° out of phase with each other. In other words, when one of the input signals is high, the other is low. During phase 1 ($V_{in}$ high and $V_{ip}$ low), the switching devices M1 and M2 are both turned on so that $V_{dp}$ and $V_{dn}$ are clamped to $V_{dd}$ and ground respectively. During phase 2 ($V_{in}$ low and $V_{ip}$ high), the switching devices M1 and M2 are both turned off. The voltage at $V_{dn}$ rises and begins to ring at a frequency determined by the values of the components L1, C1, C3, L2, and C2. For the best efficiency, these components are chosen so that $V_{dn}$ rises and then returns to ground immediately before the end of phase 2. The voltage at $V_{dp}$ falls and rings in a similar way. The voltage at node $V_{dp}$ rises back to $V_{dd}$ immediately before the end of phase 2, when switching devices M1 and M2 are turned on.

The peak voltages present across the switching devices M1 and M2 can be adjusted as desired by changing the passive component values in the circuit under the constraint that the average voltage of $V_{dn}$ must equal that of $V_{dp}$. If this average voltage lies at $V_{dd}/2$ then the peak value of $V_{dn}$ will be only slightly higher than $V_{dd}$ and that of $V_{dp}$ will be only slightly lower than ground. The duty cycle of the input signals $V_{in}$ and $V_{ip}$ waveforms can be adjusted to reduce the peak voltages even further. As a result, this configuration eliminates the large signal swings that transistors are subjected to in the prior art.

Figure 6:
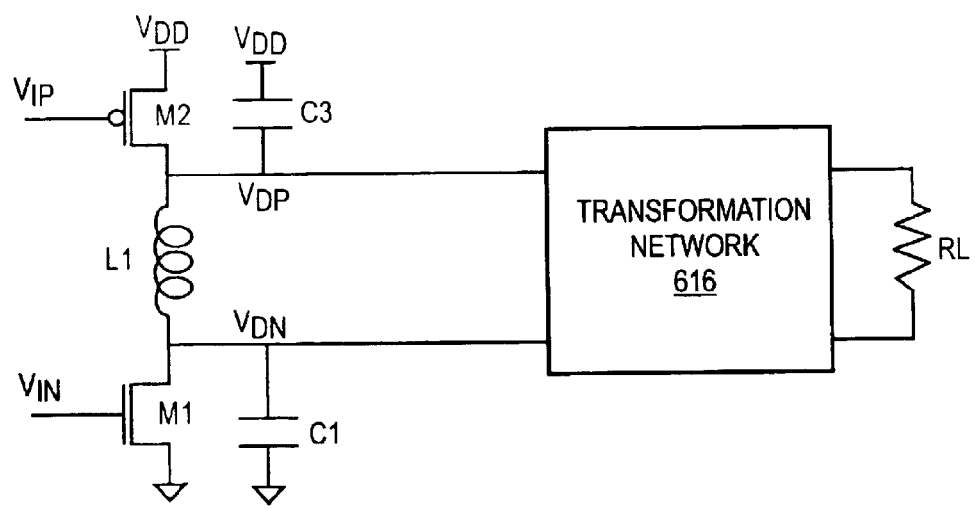
FIG. 6 is a schematic diagram of an embodiment of a power amplifier of the present invention with a load connected differentially.

The power amplifier shown in FIG. 4 does not take full advantage of the signal swing that occurs on node $V_{dp}$. An increase in efficiency can be achieved by making use of the signal swing on both $V_{dp}$ and $V_{dn}$. This can be accomplished by connecting the load differentially across nodes $V_{dp}$ and $V_{dn}$ as shown in FIG. 6. FIG. 6 shows a power amplifier similar to that shown in FIG. 4. The power amplifier includes switching devices M1 and M2, inductor L1, and capacitors C1 and C3. A transformation network 616 is connected to both nodes $V_{dp}$ and $V_{dn}$. A load $R_L$ is connected to the transformation network 616. The waveforms for the power amplifier shown in FIG. 6 are similar to those for the power amplifier shown in FIG. 4. In this embodiment, the current flowing through the load $R_L$ is determined by the difference between the voltages on $V_{dp}$ and $V_{dn}$.

Figure 7:
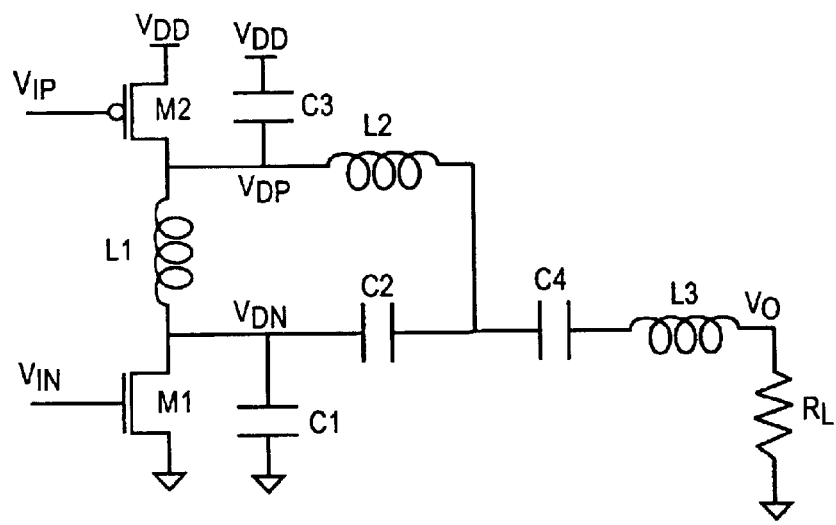
FIG. 7 is a schematic diagram of an embodiment of a power amplifier of the present invention connected to a single-ended load.

When a single-ended load is required, the transformation network can be made to facilitate a single-ended load. FIG. 7 shows a power amplifier with two capacitors C2 and C4 and an inductor L3 connected as shown between $V_{dn}$ and $V_o$. An inductor L2 is connected between $V_{dp}$ and the connection point of the capacitors C2 and C4. A single-ended load $R_L$ is connected between $V_o$ and ground. The waveforms for the power amplifier shown in FIG. 7 are similar to those for the power amplifier shown in FIG. 4. In this embodiment, the current flowing to the output from $V_{dp}$ and current flowing to the output from $V_{dn}$ add when they are summed in phase at the load. The load is AC coupled from either $V_{dp}$ or $V_{dn}$ by capacitor C4. The inductor L2 and capacitor C2 can also be chosen to transform the load impedance $R_L$ into a desired impedance so that power delivered to the load can be adjusted independently from the voltage swing on Vdp and Vdn. In this case, the voltage swing on $V_o$ will vary from that on $V_{dp}$ and $V_{dn}$ as determined by the selection of C2 and L2. Since the combination of L2 and C2 is a tuned circuit, it provides some bandpass filtering. If additional filtering is desired, capacitor C4 and inductor L3 can also be used as an additional bandpass filter. In summary, L2 and C2 in the configuration of FIG. 7 simultaneously perform the functions of impedance transformation, filtering, and differential-to-single-ended conversion.

Figure 8:
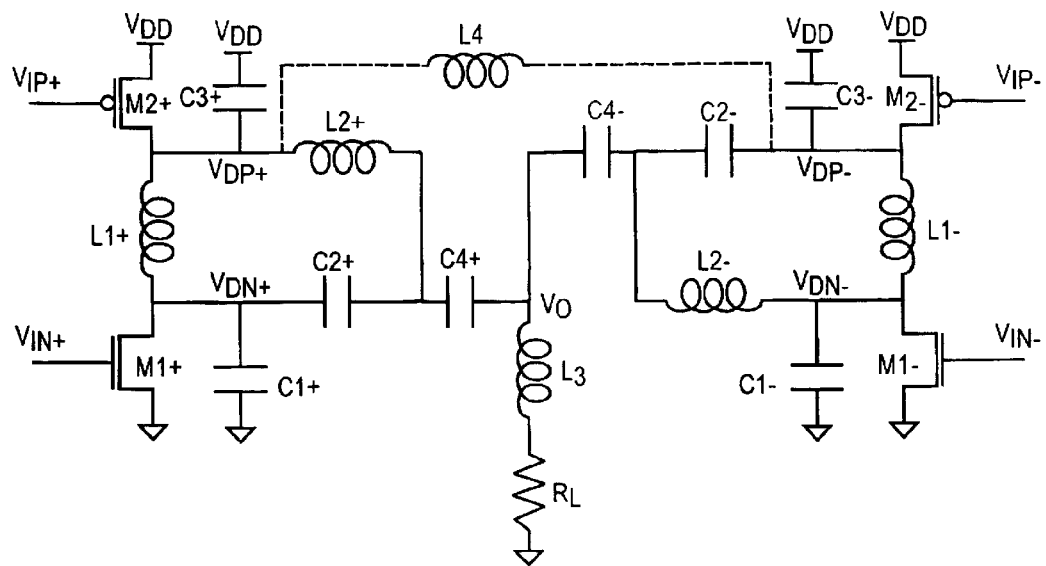
FIG. 8 is a schematic diagram of an embodiment of a power amplifier of the present invention connected differentially.
Figure 9:
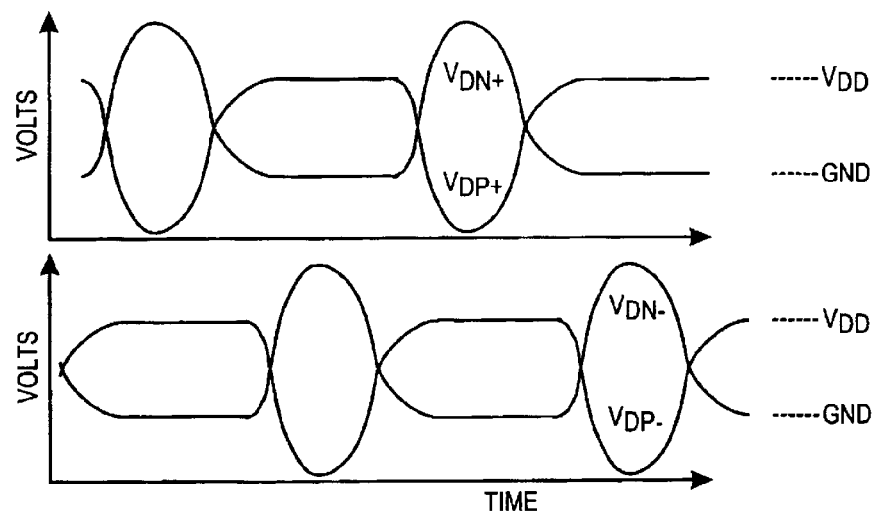
FIG. 9 is a timing diagram illustrating the voltages present in the amplifier shown in FIG. 8.

The amplifier of the present invention may also be implemented differentially using two amplifiers (such as the amplifier shown in FIG. 7) connected together as shown in FIG. 8. FIG. 8 shows a first amplifier (the positive side) comprised of switching devices M1+ and M2+, inductor L1+, capacitors C1+ and C3+, and a transformation network comprised of capacitors C2+ and C4+ and inductors L2+ and L3. A second amplifier (the negative side) is comprised of switching devices M1− and M2−, inductor L1−, capacitors C1− and C3−, and a transformation network comprised of capacitors C2− and C4− and inductors L2− and L3. The two amplifiers are similar to each other with the inductors L2 and capacitors C2 interchanged as shown. The input signals $V_{in-}$ and $V_{ip-}$ on the negative side are shifted by 180 degrees from the input signals $V_{in+}$ and $V_{ip+}$ on the positive side. FIG. 9 is a timing diagram illustrating the voltages present at the nodes $V_{d+}$, $V_{dp+}$, $V_{dn-}$, and $V_{dp-}$.

The values of the passive components in the amplifier shown in FIG. 8 may be chosen so that the resulting currents from both amplifiers sum in phase at the load $R_L$. The advantages of the power amplifier shown in FIG. 8 are similar to the advantages common to differential circuits in general. For example, undesired interference from supply or substrate noise is common-mode. Another advantage is that the impact of supply resistance is reduced because the supply current flows during both clock phases.

Note that the load $R_L$ shown in FIG. 8 could be connected to only two of the four output nodes of the power amplifier. For example, a configuration similar to that shown in FIG. 4 could be connected differentially to the load $R_L$, where the nodes $V_{dp+}$ and $V_{dp-}$ are not connected to $V_o$.

FIG. 8 also shows an alternate embodiment where an optional inductor L4 is connected (shown in dashed lines) between nodes $V_{dp+}$ and $V_{dp-}$. Without the optional inductor L4, the voltage swings on nodes Vdp+, Vdp−, Vdn+ and Vdn− and the values of capacitors C1+, C1−, C3+ and C3− can not be independently adjusted. The optional inductor L4 has the advantage that these voltage swings can be adjusted independently of the capacitance values mentioned above.

The capacitors C1 and C3 described above are used to shape the waveforms of the voltages on $V_{dp}$ and $V_{dn}$. As mentioned above, these capacitances may be provided by separate capacitors or by the parasitic capacitances of switching devices M1 and M2. In another embodiment, these capacitances are formed by switching devices in a way that improves the efficiency of the amplifier.

Figure 10:
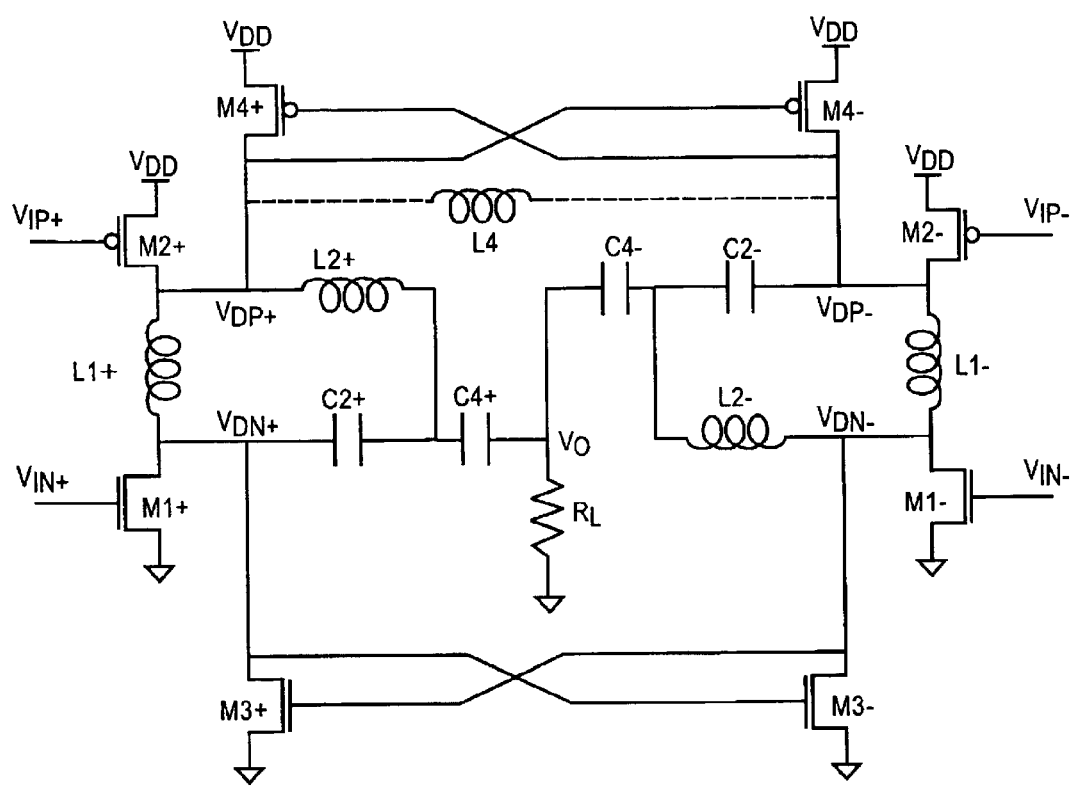
FIG. 10 is a schematic diagram of an embodiment of a power amplifier of the present invention.

FIG. 10 is a schematic diagram of a power amplifier similar to the amplifier shown in FIG. 8. In the amplifier shown in FIG. 10, the capacitors C1+ and C3+ are replaced by switching devices M3− and M4−, respectively. Similarly, the capacitors C1− and C3− are replaced by switching devices M3+ and M4+, respectively. Each of the switching devices M3 and M4 are driven as shown by a voltage from the opposite amplifier. For example, the switching device M4+ is driven by the voltage at $V_{dp-}$ on the negative side. The switching device M4− is driven by the voltage at $V_{dp}+$ on the positive side. Similarly, the switching device M3+ is driven by the voltage at $V_{dn-}$ while the switching device M3− is driven by the voltage at $V_{dn+}$. The waveforms for the amplifier shown in FIG. 10 are similar to those described above.

The amplifier shown in FIG. 10 allows the switching devices M1+ and M1− to be made smaller by an amount equal to the size of switching devices M3+ and M3−. Similarly, the switching devices M2+ and M2− can be made smaller by an amount equal to the size of switching devices M4+ and M4−. However, switching devices M1 and M2 should remain sufficiently large to assure stability of the circuit. A decrease in the size of the switching devices M1 and M2 improves the efficiency since the input capacitances that must be driven are smaller. Another advantage to the amplifier shown in FIG. 10 is that cross-coupling helps to assure that the waveforms present at $V_{dp-}$ and $V_{dn-}$ have the correct phase relationship to the waveforms present at $V_{dp+}$ and $V_{dn+}$, despite possible timing variations on the positive inputs ($V_{ip+}$, $V_{in+}$) and on the negative inputs ($V_{ip-}$, $V_{in-}$).

FIG. 10 also shows an alternate embodiment where an optional inductor L4 is connected (shown in dashed lines) between nodes $V_{dp+}$ and $V_{dp-}$, similar to the inductor L4 shown in FIG. 8. If the optional inductor L4 is connected, the voltage swings of nodes Vdp+, Vdp−, Vdn+, and Vdn− can be chosen independently from the input capacitances of M4−, M4+, M3−, M3+.

Figure 11:
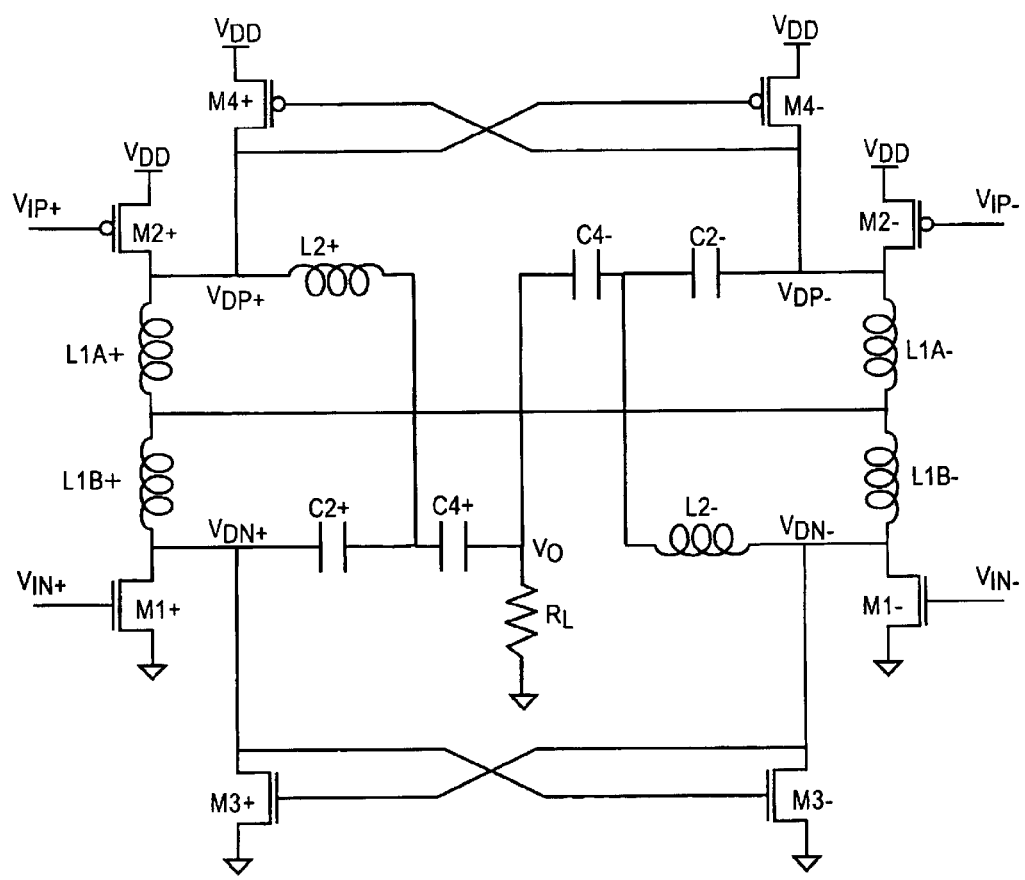
FIG. 11 is a schematic diagram of another embodiment of a power amplifier of the present invention.

FIG. 11 is a schematic diagram of a power amplifier similar to the amplifier shown in FIG. 10, but with the inductors L1+ and L1− replaced. Inductor L+ is replaced with a pair of inductors L1A+ and L1B+. Inductor L1− is replaced with a pair of inductors L1A− and L1B−. The node formed by the connection of inductors L1A+ and L1B+ is connected to the node formed by the connection of inductors L1A− and LiB−. The embodiment shown in FIG. 11 has similar advantages to the embodiment in FIG. 10 with the optional inductor L4 in that it allows the voltage swings of nodes Vdp+, Vdp−, Vdn+, and Vdn− to be chosen independently from the input capacitances of M4−, M4+, M3−, M3+.

Figure 12:
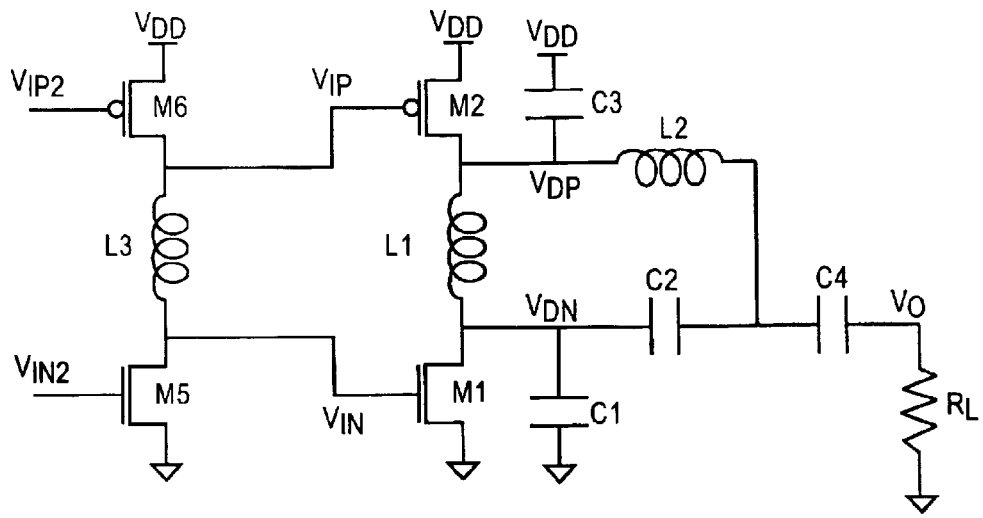
FIG. 12 is a schematic diagram of an embodiment of a power amplifier of the present invention having a preamplifier circuit.

As described above with respect to FIG. 3, input buffer circuitry may be used to drive the gates of the switching devices M1 and M2 of the amplifiers described above. However, the efficiency may be improved if a similar amplifier circuit is used as a preamplifier circuit. FIG. 12 is an example of an amplifier having a preamplifier circuit.

FIG. 12 shows an amplifier similar to the amplifier shown in FIG. 7. At the input of the amplifier, a preamplifier is shown. The preamplifier is comprised of switching devices M5 and M6 connected between ground and $V_{dd}$. An inductor L3 is connected between the switching devices M5 and M6. The preamplifier includes inputs $V_{ip2}$ and $V_{in2}$. The preamplifier circuit receives input signals $V_{ip2}$ and $V_{in2}$ and generates signals $V_{ip}$ and $V_{in}$ for use by the amplifier. The preamplifier circuit is similar to the amplifiers described above, except that all of the passive elements except inductor L3 are eliminated. The capacitances required by the preamplifier circuitry are formed from the input capacitances of the gates of switching devices M1 and M2. Of course, other passive elements could be used with the preamplifier circuit.

Figure 13:
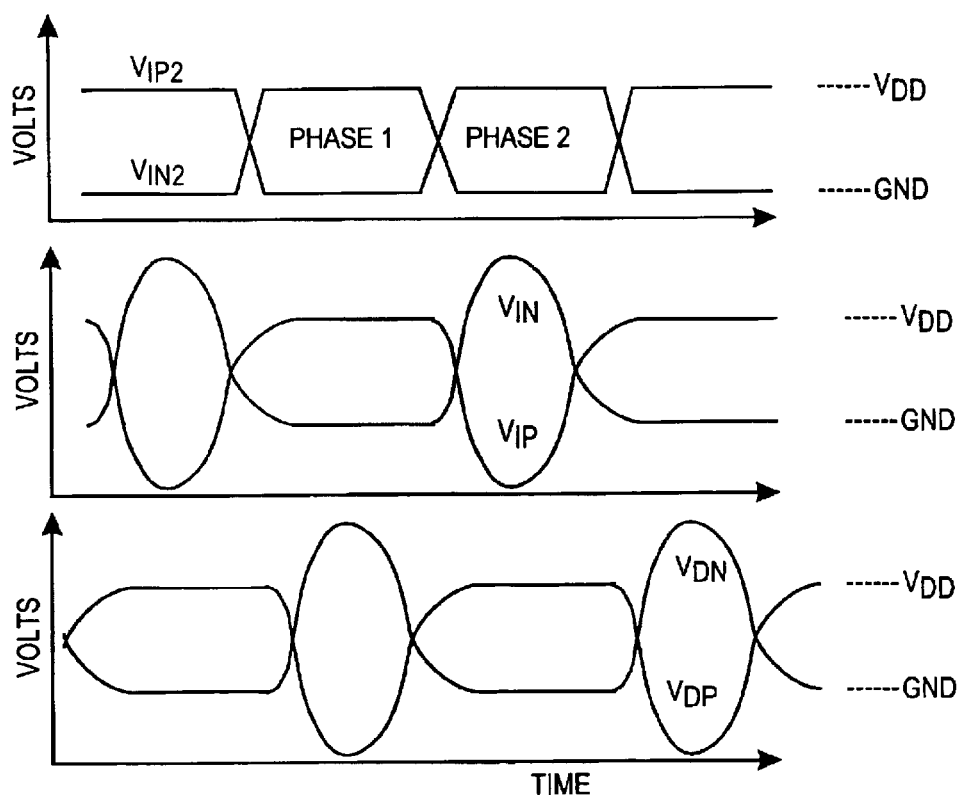
FIG. 13 is a timing diagram illustrating the voltages present in the amplifier shown in FIG. 12.

FIG. 13 is a timing diagram illustrating the waveforms at $V_{in}$, $V_{ip}$, $V_{dn}$, and $V_{dp}$ of FIG. 12. The preamplifier output waveforms $V_{ip}$ and $V_{in}$ have a shape that makes them well suited for driving the input gates of switching devices M1 and M2 in the final stage.

Note that in an alternate configuration the capacitor C4 could be connected between inductor L2 and $V_o$ with capacitor C2 connected between $V_{dn}$ and $V_o$. This alternate configuration functions similarly to the configuration shown in FIG. 12.

Figure 14:
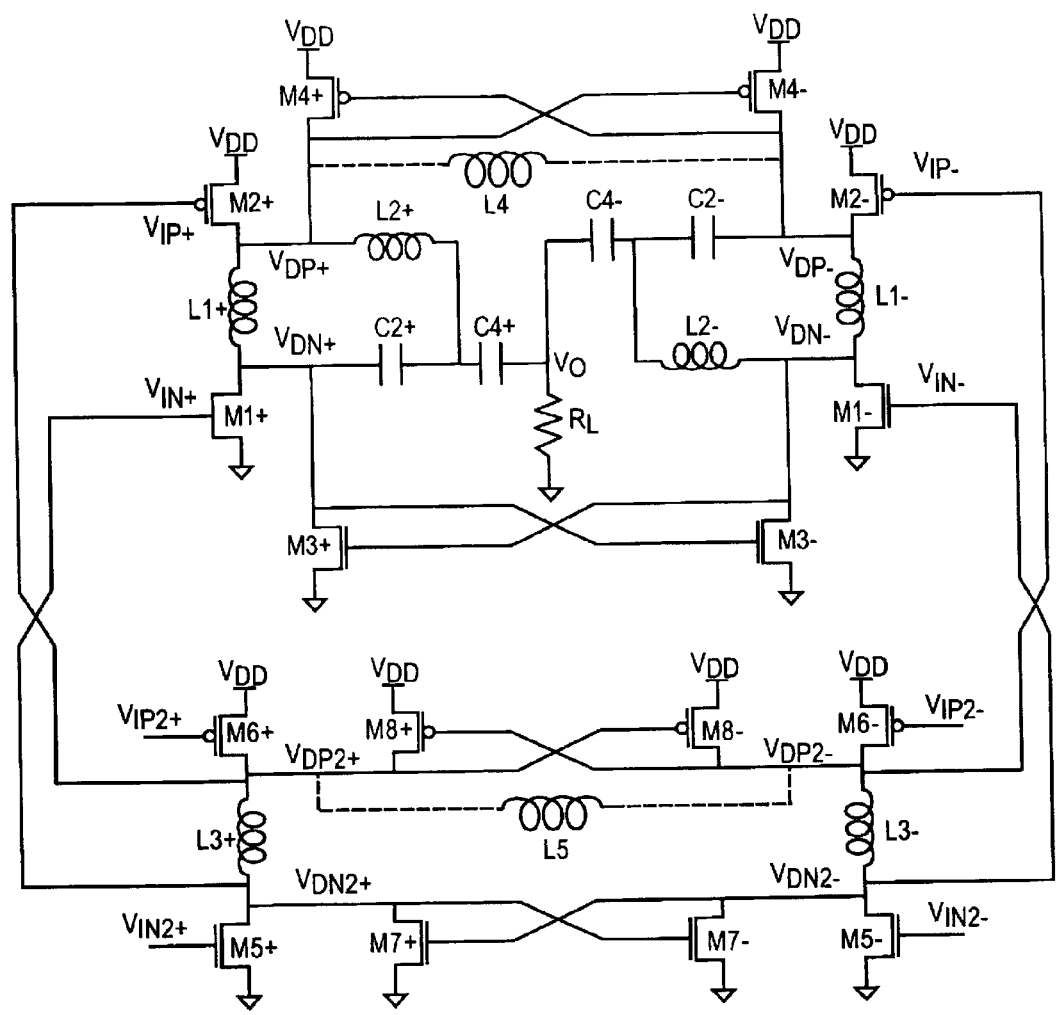
FIG. 14 is a schematic diagram of an embodiment of a two-stage differential power amplifier of the present invention.

FIG. 14 is a schematic diagram of an amplifier using a two-stage differential configuration which provides an increased efficiency over the circuit shown in FIG. 12. The amplifier shown in FIG. 14 is similar to the differential amplifier shown in FIG. 10, with the addition of preamplifier circuitry. The inputs $V_{ip+}$ and $V_{in+}$ of the amplifier are connected to preamplifier circuitry comprised of switching devices M5+ and M6+. The switching devices M5+ and M6+ are connected between ground and $V_{dd}$, with an inductor L3+ connected between them. Capacitances are provided to nodes $V_{dp2+}$ and $V_{dn2+}$ by switching devices M8+ and M7+, respectively. The negative side of the amplifier is configured in the same manner. The positive and negative sides of the preamplifier circuitry are cross-coupled in the same way as the amplifier circuitry shown in FIG. 10 (described above). In this configuration, the input capacitances of the NMOS and PMOS switching devices M1 and M2 of the power amplifier, the input capacitances of the preamplifier switching devices M7 and M8, and the value of inductor L5 can be adjusted so that the signals at $V_{dp2}$ and $V_{dn2}$ have the desired peak amplitudes.

Another aspect of the present invention relates to a circuit and method of providing differential-to-single ended output conversion and impedance transformation from differential signals. Differential circuits have a number of advantages that are well known. For example, the impact from noise sources is reduced since these signals are common-mode (i.e., the positive and negative sides are effected identically). In addition, even-order harmonics are reduced because of circuit symmetry. Because of these and other advantages, a differential configuration may be desirable even when the load is single-ended. If a single-ended load is needed, circuitry for differential-to-single-ended conversion is needed.

Figure 15:
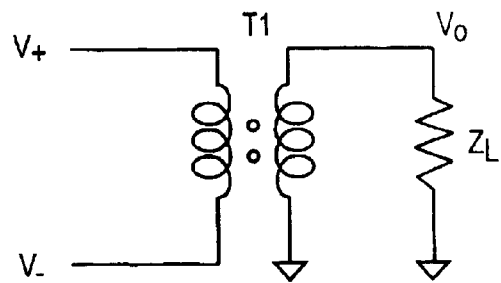
FIG. 15 is a schematic diagram of a prior art circuit used for performing differential-to-single-ended conversion.

One prior art method for performing differential-to-single-ended conversion at high frequency involves use of a transformer or balun. FIG. 15 shows a prior art circuit used for performing differential-to-single-ended conversion using a transformer T1. The primary side of the transformer T1 is connected to a first differential input $V_+$ and a second differential input $V_-$. The secondary side of the transformer T1 is connected to ground and an output node $V_O$. A load $Z_L$ is connected between ground and the output node $V_O$. If the transformer has a 1-to-1 turns ratio, then the differential signals $V_+$ and $V_-$ are translated into a signal having an amplitude of $(V_{30} - V_-)$ across the load $Z_L$.

In some applications, impedance matching or impedance transformation is needed to transform a given load impedance into a different impedance seen by the driver. Impedance transformation can be accomplished, as part of the differential-to-single ended conversion, using the transformer circuit shown in FIG. 15 by adjusting the winding ratio of the transformer T1. However, the use of transformers for differential-to-single-ended conversion and impedance transformation has disadvantages. First, high quality transformers are larger and more costly than other passive elements and are not easily integrated with other semiconductor circuits. Second, practical transformers have imperfect magnetic coupling which causes a loss of power from input to output.

Figure 16:
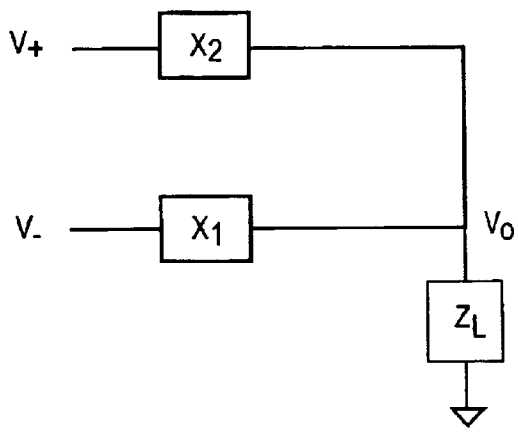
FIG. 16 is a block diagram of a differential-to-single-ended conversion and impedance transformation circuit of the present invention.
Figure 17:
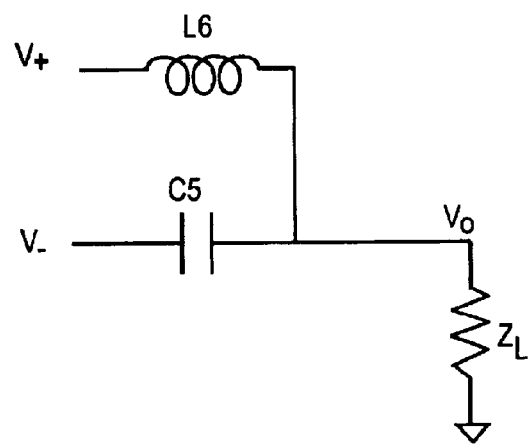
FIG. 17 is a schematic diagram of a differential-to-single-ended conversion and impedance transformation circuit of the present invention.

The present invention provides a technique that performs differential-to-single ended conversion as well as impedance transformation and avoids the disadvantages of a transformer solution. FIG. 16 shows a block diagram of a differential-to-single-ended conversion and impedance transformation circuit. The circuit has a first impedance $X_1$ coupled between the second differential input signal $V_-$ and an output node $V_O$. A second impedance $X_2$ is coupled between the first differential input signal $V_+$ and the output node $V_O$. A load $Z_L$ is connected between the output node $V_O$ and ground. In the circuit shown in FIG. 16, current flowing to the output node $V_O$ from differential input $V_+$ is shifted in phase from the voltage on $V_+$. Similarly, current flowing to the output node $V_O$ from differential input $V_-$ is shifted in phase from the voltage on $V_-$. The impedances X1 and X2 are chosen so that these two currents add together when they are summed at the load $Z_L$. For example, if X1 shifts the output current by +90 degrees and X2 shifts the output current by −90 degrees then the resultant currents will sum in phase at the load. FIG. 17 illustrates one example of an implementation of the circuit shown in FIG. 16. FIG. 17 shows an L-C differential-to-single-ended conversion and impedance transformation circuit. The impedance X1 is comprised of a capacitor C5 which is coupled between the second differential input signal $V_-$ and the output node $V_O$. The impedance X2 is comprised of an inductor L6 which is coupled between the first differential input signal $V_+$ and the output node $V_O$.

Referring back to FIG. 16, since the inputs V+ and V− are differential, the inputs have opposite signs. However, the differential inputs $V_+$ and $V_-$ are not necessarily equal in amplitude. The output voltage $V_O$ of the differential-to-single-ended conversion and impedance transformation circuit is given by the following equation:

$$V_O = \frac{(V_+ X_1 + V_- X_2)(-jX_2 X_1 + (X_1 + X_2)Z_L)}{((X_1 X_2)^2 + (X_1 + X_2)^2 Z_L^2)} Z_L. \quad (1)$$

The power $P_L$ delivered to the load $Z_L$ is given by the following equation:

$$P_L = \frac{(V_+ X_1 + V_- X_2)^2}{((X_1 X_2)^2 + (X_1 + X_2)^2 Z_L^2)} Z_L. \quad (2)$$

Differential-to-single-ended conversion is achieved if the impedances $X_1$ and $X_2$ have opposite signs. Impedances $X_1$ and $X_2$ may be comprised of any combination of reactive elements (e.g., capacitor C5 and inductor L6 shown in FIG. 17) whose combination meets this requirement. For example, if differential inputs $V_+$ and $V_-$ have equal amplitudes A, and impedances $X_1$ and $X_2$ have equal amplitudes X, then the output voltage $V_O$ can be determined by substituting these values into equation (1) above. The resulting output voltage $V_O$ is given by the following equation:

$$V_O = -j2A\frac{Z_L}{X}. \quad (3)$$

It can be seen from equation (3) that the ratio R/X can be chosen so that the amplitude of the output $V_O$ is either larger or smaller than the amplitude A of the differential input. The voltage of the output $V_O$ increases as the value of X decreases. Similarly, the voltage of the output $V_O$ decreases as the value of X increases.

Figure 18:
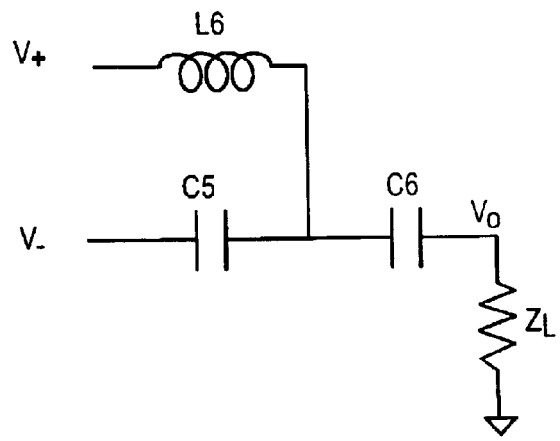
FIGS. 18 and 19 are schematic diagrams illustrating differential inputs AC-coupled from a load.
Figure 19:
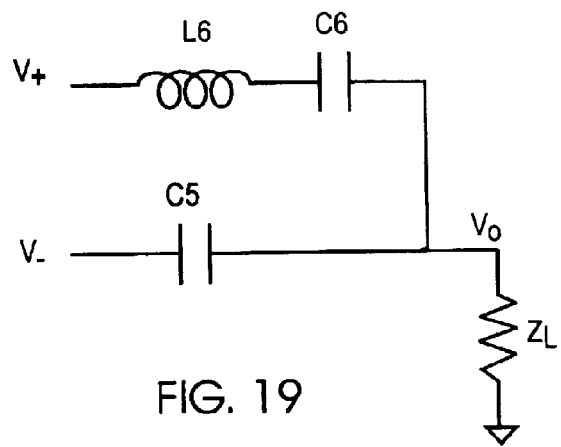

In certain applications, the load $Z_L$ must be AC-coupled from one of the differential inputs $V_-$ or $V_+$. FIGS. 18 and 19 show examples of a how the differential inputs may be AC-coupled from the load $Z_L$ in the example shown in FIG. 17. In the circuit shown in FIG. 18, an additional capacitor C6 is inserted between the output node $V_O$ and both the capacitor C5 and the inductor L6. The capacitor C6 AC-couples the output node $V_O$ from the first and second differential inputs $V_+$ and $V_-$. In the circuit shown in FIG. 19, an additional capacitor C6 is inserted between the output node $V_O$ and the inductor L6. The capacitor C6 AC-couples the output node $V_O$ from the first differential input $V_+$. Note that the capacitor C1 provides AC-coupling between the output node $V_O$ from the second differential input $V_-$.

Figure 20:
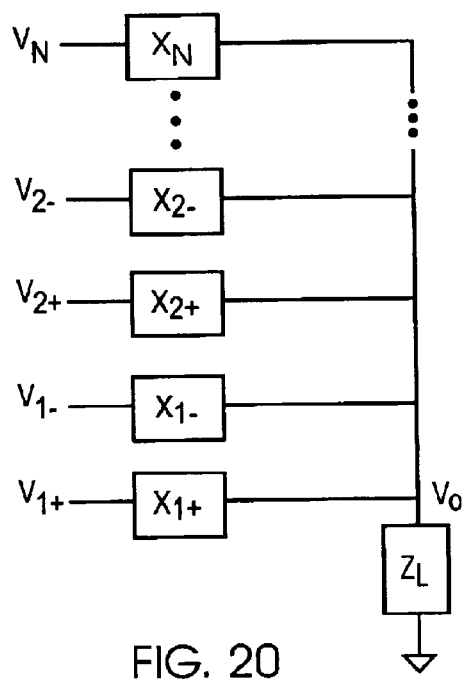
FIG. 20 is a block diagram of a differential-to-single-ended conversion and impedance transformation circuit having multiple differential inputs.

The techniques for providing differential-to-single-ended conversion and impedance transformation described above can be applied to circuits having multiple differential inputs. FIG. 20 shows a differential-to-single-ended conversion and impedance transformation circuit having multiple differential inputs. FIG. 20 shows differential inputs $V_1$ through $V_N$, where N is the total number of differential inputs. A first impedance $X_1$ is coupled between the differential input $V_1$ and the output node $V_O$. A second impedance $X_2$ is coupled between the differential input $V_1$ and the output node $V_O$. Similarly, an Nth impedance $X_N$ is coupled between the differential input $V_N$ and the output node $V_O$. Each of the currents from each differential input is summed in phase at the output node $V_O$. In this embodiment, the impedance $X_j$ between the jth differential input $V_j$ and the output node $V_O$ will depend on its phase with respect to that of other differential inputs. Optimal power transfer to the load $Z_1$ occurs when the impedances $X_j$ are purely reactive. However, this technique may still be applied when impedance $X_j$ is not purely reactive. For example, this might occur when actual inductors and capacitors have a series resistance.

As mentioned above, the RF power amplifier shown in FIG. 3 includes a voltage regulator 314 connected between the power amplifier 310 and a source of battery voltage VB to provide a voltage source VDD. In one embodiment of the present invention, the voltage regulator 314 resides on the same integrated circuit as the power amplifier circuit The function of the voltage regulator is to provide a source of voltage to the power amplifier and to help control the output power level. For example, in a cellular phone environment, a base station may dictate the power level at which each cell phone should transmit (based on factors such as the physical distance from the base station, for example). Varying the voltage level (VDD) can control the output power of the power amplifier. As the voltage of the voltage source VDD increases, the output power increases. Therefore, by controlling the operation of the voltage regulator, and therefore controlling the voltage of voltage source VDD, the output power of the amplifier can be controlled. While the power amplifier 310 will function with any suitable voltage regulator or voltage source, described below is a detailed description of a suitable voltage regulator.

Figure 21:
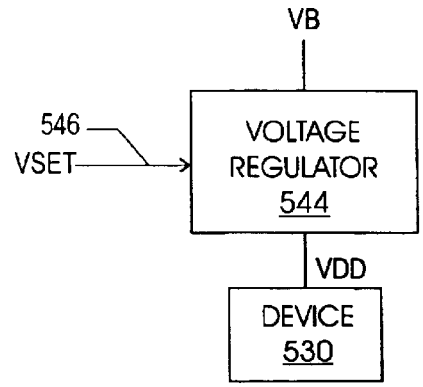
FIG. 21 is a block diagram of a voltage regulator of the present invention.

FIG. 21 is a block diagram of a voltage regulator 544 used to provide a regulated voltage VDD from a voltage source VB, for example, from a battery. As shown, the regulated voltage VDD is provided to a device 530. The device 530 may be any type of device requiring a voltage source including, but not limited to power amplifiers. The voltage regulator 544 includes an input 546 that is connected to a control signal VSET to control the voltage level VDD provided to the device 530. Following is a detailed description of the voltage regulator of the present invention in the context of its use in an RF power amplifier (such as that shown in FIG. 3). However, it is understood that the voltage regulator may be used with any type of amplifier as well as any other type of device requiring a voltage source.

Figure 22:
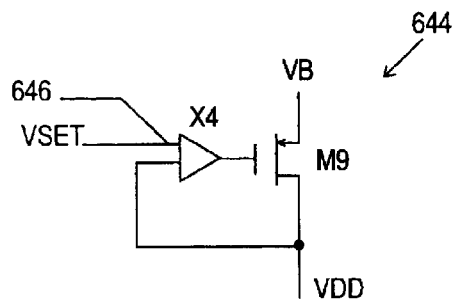
FIG. 22 is a schematic diagram of an embodiment of a voltage regulator of the present invention.

FIG. 22 is a schematic diagram of a first embodiment of a voltage regulator 644 connected to a battery voltage VB. The voltage regulator 644 is comprised of a device M9 and an op amp X4. The op amp X4 includes a first input 646 for connection to a voltage control signal VSET. In a preferred embodiment, the control signal VSET is an analog voltage signal that is proportional to the desired voltage level. The other input to the op amp X4 is connected to the regulated voltage VDD. The output of the op amp X4 is connected to the input of the device M9.

Figure 23:
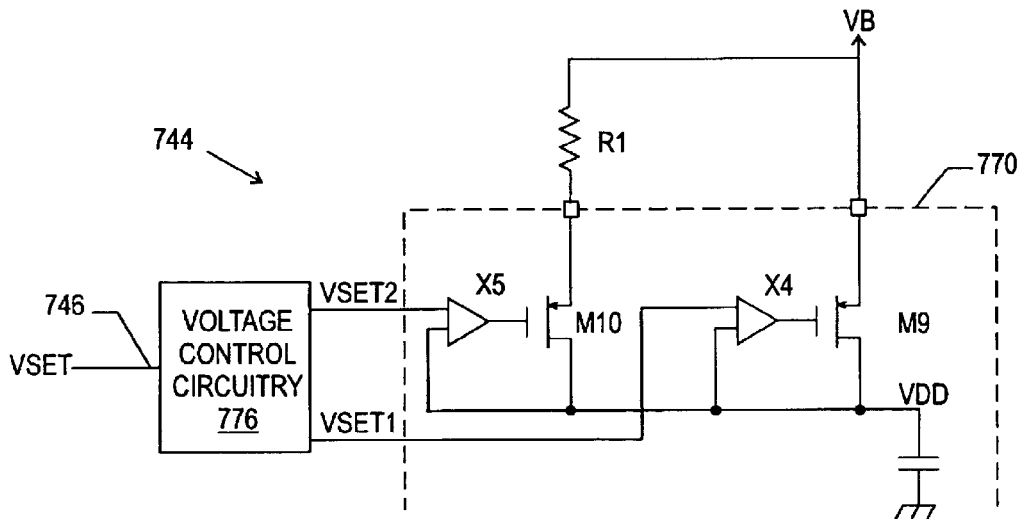
FIG. 23 is a schematic diagram of an embodiment of a voltage regulator of the present invention.

FIG. 23 is a schematic diagram of another embodiment of a voltage regulator 744 connected to a battery voltage VB. The voltage regulator 744 is similar to the voltage regulator 644 shown in FIG. 22 with the addition of a second regulator circuit comprised of op amp X5, switching device M10, and an external resistor R1. FIG. 23 also shows an integrated circuit 770 (dashed lines) to illustrate that the power amplifier is formed on the integrated circuit 770 while the resistor R1 is not. The integrated circuit 770 may also be the same integrated circuit on which the device to be powered resides.

The first regulator circuit is connected in the same manner as the regulator circuit shown in FIG. 22. The op amp X5 of the second regulator circuit includes an input VSET2 for connection to a voltage control signal. The other input to the op amp X5 is connected to the regulated voltage VDD. The output of the op amp X5 is connected to the gate of the device M1. The external resistor R1 is connected between the battery voltage VB and the device M1. FIG. 23 also shows voltage control circuitry 776 which has an input 746 connected to the control signal VSET. The voltage control circuitry 776 uses the signal VSET to create voltage control signals VSET1 and VSET2 for use by the first and second regulator circuits. By controlling both regulators, the voltage level VDD can be controlled. In addition, by selectively activating the second regulator, power can be dissipated off the integrated circuit 770 (via resistor R1). This results in a reduction of heat generated in the integrated circuit 770.

The voltage regulator 744 operates as follows. Since it is desired to minimize the amount of power dissipated on the integrated circuit 770, one goal is to maximize the use of the second regulator circuit (X5, M10) in order to maximize power dissipation through the external resistor R1. Therefore, voltage control circuitry 776 will enable the second regulator circuit to provide as much power as it can before enabling the first regulator circuit (X4, M9). In other words, when more power is required than the second regulator circuit can provide, the first regulator circuit is enabled to provide additional power. In this way, the maximum amount of power will be dissipated through external resistor R1.

Figure 24:
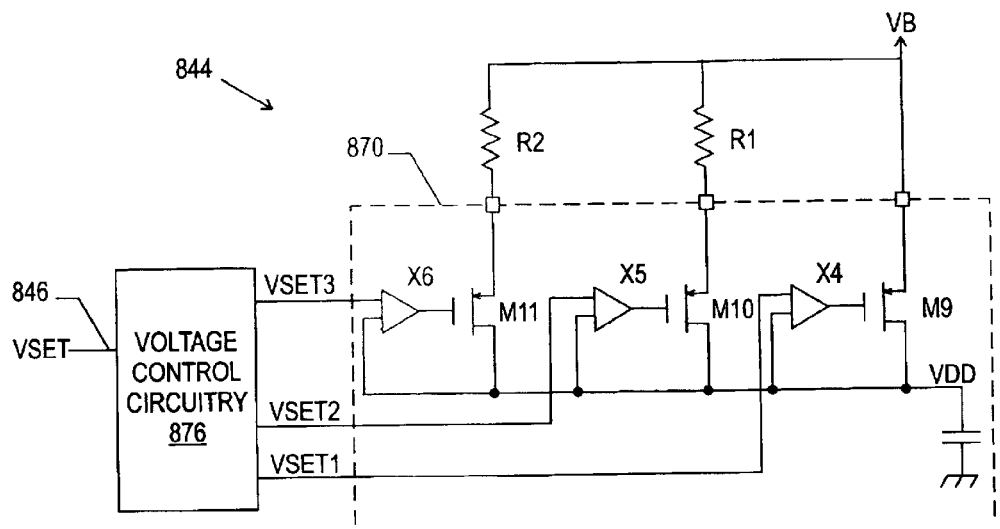
FIG. 24 is a schematic diagram of an embodiment of a voltage regulator of the present invention.

FIG. 24 is a schematic diagram of another embodiment of voltage regulator 844 having multiple regulators and multiple external resistors. The voltage regulator 844 is similar to the regulator 744 shown in FIG. 23, with the addition of a third regulator circuit comprised of device M11, op amp X6, and external resistor R2. The third regulator circuit is connected in the same ways as the second regulator circuit, and operates in a similar manner. The op amp X6 of the third regulator circuit includes an input VSET3 for connection to a voltage control signal. The other input to the op amp X5 is connected to the regulated voltage VDD. The output of the op amp X6 is connected to the gate of device M11. The external resistor R2 is connected between the batter voltage VB and device M11. FIG. 24 also shows voltage control circuitry 876 which has an input 846 connected to the control signal VSET. The voltage control circuitry 876 uses the signal VSET to create voltage control signals VSET1, VSET2, and VSET3 for use by the regulator circuits. By activating the second or third regulator, power can be dissipated off the integrated circuit 870 (via resistor R1 and/or R2). This results in a reduction of heat generated in the integrated circuit 870.

The voltage regulator 844 operates as follows. Since it is desired to minimize the amount of power dissipated on the integrated circuit 870, one goal is to maximize the use of the second and third regulator circuits in order to maximize power dissipation through the external resistors R1 and R2. Therefore, voltage control circuitry 876 will enable the second and third regulator circuits to provide as much power as it can before enabling the first regulator circuit. In other words, when more power is required than the second and/or third regulator circuit can provide, the first regulator circuit is enabled to provide additional power. In this way, the maximum amount of power will be dissipated through external resistors R1 and R2.

The values of the resistors R1 and R2 may be equal, or may be different, depending on the needs of a user. In addition, the invention is not limited to the use of one or two external resistors. Additional regulator circuits and external resistors could be added. In one embodiment, the value of resistor R1 is 0.7 ohms and the value of resistor R2 is 0.3 ohms.

Another benefit of the present invention involves the use of dual gate oxide devices. In CMOS digital systems, it is sometimes desired to provide devices suitable for use with two voltage levels (e.g., 3.3 volts and 5 volts). Therefore, processing technologies have been developed to provide a single integrated circuit having both 0.5 $\mu$m and 0.35 $\mu$m devices. As mentioned above, a thicker gate oxide results in a device with a higher breakdown voltage. On the other hand, a thinner gate oxide results in a faster device, but with a lower breakdown voltage.

The RF amplifier of the present invention takes advantage of the availability of dual gate oxide devices by selectively choosing certain gate lengths for various components of the amplifier. For example, it has been discovered that for preprocessing circuitry or pre-driver circuitry, a high speed is desirable and breakdown voltage is not as important. Therefore these devices are designed using a thinner gate oxide. For output state devices, where a high breakdown voltage is more important, the devices are designed using a thicker gate oxide.

In one embodiment, a dual gate oxide device is used to create an RF amplifier such as the RF amplifier shown in FIGS. 12, and 14. One suitable use of dual gate oxides in these amplifiers is to utilize devices having channel lengths of both 0.5 $\mu$m and 0.35 $\mu$m. The 0.5 $\mu$m and 0.35 $\mu$m devices have gate oxide thicknesses of 140 Angstroms (Å) and 70 Å, respectively. Referring to the example shown in FIG. 12, the predriver devices M5 and M6 can be chosen with much smaller device widths than the output devices M1 and M2. In this case, the predriver output signals Vip and Vin are nearly sinusoidal, the voltage difference (Vip−Vin) varies between about +Vdd and −Vdd, and the input capacitances of M1 and M2 can be chosen so that neither M5 nor M6 experiences a voltage drop that is larger than Vdd. As a result, a high breakdown voltage is not critical for the predriver and devices M5 and M6 can be implemented using 0.35 $\mu$m devices. When high efficiency is desired, switching devices M1 and M2 of the final amplifier stage are sized with large device widths so that nodes Vdn and Vdp are strongly clamped to their respective supply voltages of ground and Vdd when these devices are on. In this case, the voltage difference (Vdp−Vdn) varies over a range that is larger than that of the predriver and either M1, M2, or both will experience a voltage drop that is larger than Vdd. Since a higher breakdown voltage is desired from these devices, M1 and M2 can each be implemented using 0.5 μm devices. Since PMOS transistors are typically slower than NMOS transistors and thicker gate oxide devices are slower than thinner gate oxide devices, it is preferable to use a thicker gate oxide for NMOS devices than for PMOS devices. An example of the use of dual gate oxide thicknesses for the RF amplifier of FIG. 14 includes only NMOS devices with a thick gate oxide. Predriver transistors M5+, M5−, M6+, M6−, M7+, M7−, M8+, and M8− are implemented using 0.35 μm devices because, as described above, they are not subjected to voltage drops greater than Vdd and breakdown is not a critical concern. As described above, the final amplifier stage experiences larger voltage swings. However these larger swings can be distributed across its NMOS and PMOS devices in such a way that only NMOS devices see a voltage swing larger than Vdd. This is accomplished by adjusting the values of inductors L1+, L1−, and L4 and the input capacitances of devices M3+, M3−, M4+, and M4−. In this approach, PMOS devices M2+, M2−, M4+, and M4− in the final amplifier stage are thinner gate oxide devices, whereas NMOS devices M1+, M1−, M3+, M3− are thicker gate oxide devices.

Of course, the present invention is not limited to the values described above. For example, as thinner gate oxides become more common, one or both thicknesses may become lower. In addition, note that the terms "thicker" or "thinner" in this description are intended to only refer to intentional or significant differences in gate oxide thicknesses. For example, the 0.35 μm devices may vary from one another by some small amount depending on manufacturing tolerances. A 0.5 μm device is considered to be "thicker" than a 0.35 μm device. Also note that this invention applies to various CMOS devices and that the RF Amplifier described above is only used as one example of the application of dual gate oxide devices of the present invention.

Another benefit of the present invention relates to how an RF power amplifier of the present invention is packaged. The design of an RF amplifier requires a low inductance and low resistance to the transistors or switching devices. In addition, RF power amplifier designs typically require a number of passive components such as inductors and capacitors. It is advantageous to integrate these components in the power amplifier package. The packaging technique of the present invention addresses these concerns by using "flip chip" technology and multi-layer ceramic chip carrier technology.

Figure 25:
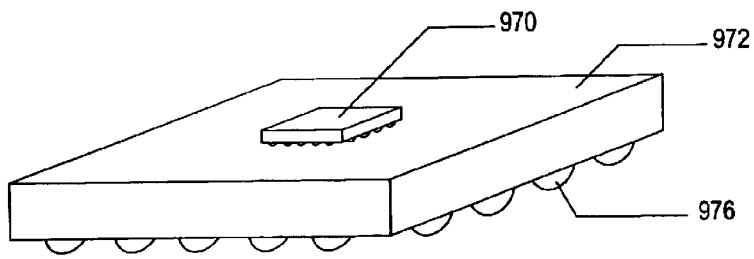
FIG. 25 is an isometric view illustrating how a device of the present invention is packaged.
Figure 26:
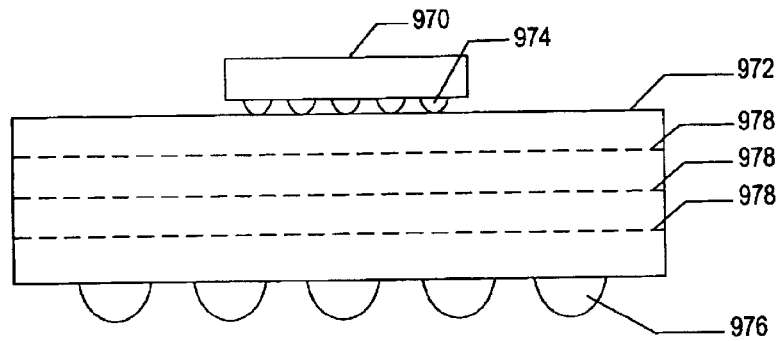
FIG. 26 is a side view of the device shown in FIG. 25.

FIGS. 25 and 26 are isometric and side views, respectively, illustrating a packaging technique of the present invention. FIGS. 25 and 26 show a "flip chip" integrated circuit 970 mounted to a multi-layer ceramic chip carrier 972. The integrated circuit 970 includes a plurality of connection points, or "bumps" 974 on the underside of the integrated circuit 970. Similarly, the ceramic chip carrier 972 includes a plurality of connection points or bumps 976. The bumps 974 of the integrated circuit 970 are formed by solder and can be mounted to corresponding conductive material formed on the upper surface of the ceramic chip carrier 972. Similarly, the bumps 976 of the ceramic chip carrier 972 are also formed by solder and are used to mount the chip carrier 972 to a printed circuit board (not shown). A typical flip chip allows 250 μm spaced bumps. A typical chip carrier also allows 250 μm spaced vias for connection to the flip chip bumps 974. In one example, 6×6 mm ceramic chip carrier includes 36 bumps 976 for connection to a PCB. Flip chip and ceramic chip carrier technologies are considered conventional and will not be described in detail.

Various benefits can be realized by selectively placing certain components of the RF power amplifier of the present invention on integrated circuit 970 and ceramic chip carrier 972. The invention will be described with respect to the RF power amplifier shown in FIG. 14, although the invention is not limited to power amplifiers. In one embodiment of the invention, all of the switching devices are formed on the integrated circuit 970. In addition, the power transistors (such as switching devices M1+, M1−, M2+, M2−) formed on the integrated circuit 970 are preferably placed directly below the bumps 974 of the integrated circuit 970 resulting in low resistance and inductance (as compared to wire bond integrated circuit packages).

The multi-layer ceramic chip carrier 972 is used to build high-Q inductors, transformers, and capacitors. This can be beneficial for CMOS power amplifier architecture since multiple inductors and capacitors may be required. For example, a single band power amplifier may require 4–8 inductors which would be impractical to build on a printed circuit board. In addition, multiple matching networks are used to provide the high transformation ratio required in a push-pull amplifier design. In one embodiment of the invention, the transformers, inductors, capacitors, and other passive devices are formed on the ceramic chip carrier 972. The ceramic chip carrier 972 includes multiple conductive layers 978 (shown as hidden lines) that can be designed to implement these passive devices.

In one embodiment of the RF power amplifier shown in FIG. 14, all of the switching devices and capacitors C2+ and C2 reside on the integrated circuit 970, with the inductors L3+, L3−, L5, L1+, L1−, L4, L2+, and L2− residing on the multi-layer ceramic chip carrier 972.

Figure 27:
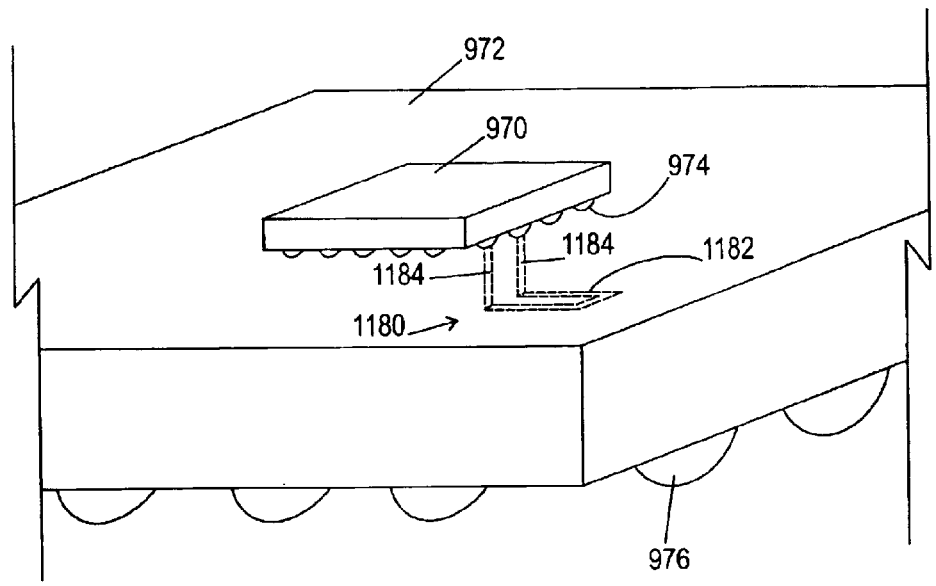
FIG. 27 is a diagram illustrating a ceramic chip carrier with an inductor formed in the carrier.

In a CMOS power amplifier design, multiple high-Q inductors are required to tune out large on-chip gate capacitances. Since these capacitances are large, the required inductors are low in value and difficult to integrate. One solution is to form high-Q inductors on the ceramic chip carrier. FIG. 27 is a diagram illustrating the ceramic chip carrier 972 shown in FIGS. 25 and 26 with a horizontally-formed inductor 1180 formed in the ceramic chip carrier 972. The inductor 1180 includes a horizontal loop portion formed by conductive tracel 1182 connected to two bumps 974 of the ceramic chip carrier 972 by two vias 1184. One disadvantage with the inductor 1180 is that the inductor connection points needs to be close to the edge of the ceramic chip carrier 972 unless the value of the inductor is large enough to route to a lower layer of the ceramic chip carrier 972.

Figure 28:
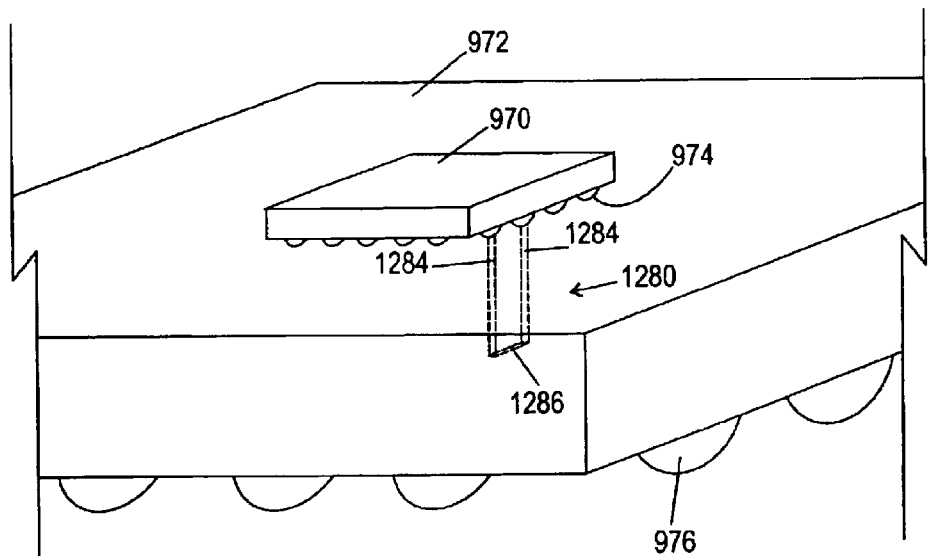
FIG. 28 is a diagram illustrating a ceramic chip carrier with a vertically-formed inductor formed in the carrier.

FIG. 28 is a diagram illustrating the ceramic chip carrier 972 with a vertically-formed inductor 1280 formed in the carrier 972. The inductor 1280 is formed in the vertical direction by vias 1284 extending to conductive trace 1286, which may be formed on a lower level of the carrier 972. As shown, the inductor 1280 extends downward into the ceramic chip carrier 972 and is coplanar, since the vias 1284 and trace 1286 exist on the same plane. The vias 1284 may be formed through several layers of the carrier 972, depending the inductance desired. A vertically-formed inductor such as the inductor 1280 has two major advantages over horizontally-formed inductors. First, the vertically-formed inductors can be formed underneath the chip 970 without blocking other routing channels. Therefore, more layout options are available, and more inductors can be formed. Second, the vertically-formed vias 1284, as opposed to the horizontal conductive trace 1182, result in less loss at RF frequencies since the vias 1284 have a greater cross-sectional surface area than the conductive traces. The vias 1284 are substantially cylindrical and have a surface area of $\pi dL$, where d is the diameter of the via 1284 (e.g., 100 $\mu$m) and L is the length of the via. The conductive traces, such as conductive trace 1182, have a surface area of 2 dL Therefore, the resistance of a via at RF frequencies is approximately $\pi/2$ less than the resistance of a conductive trace 1182.

Figure 29:
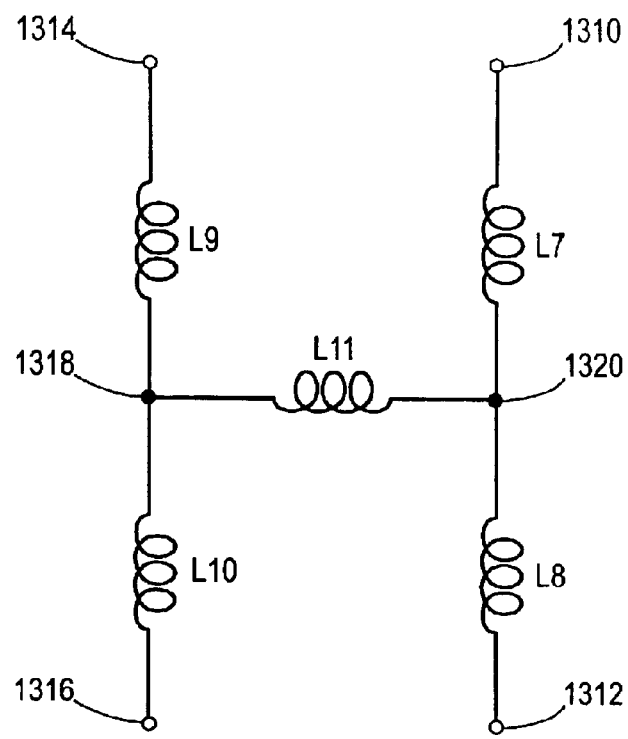
FIG. 29 is an electrical schematic diagram of inductors connected between four connection points.
Figure 30:
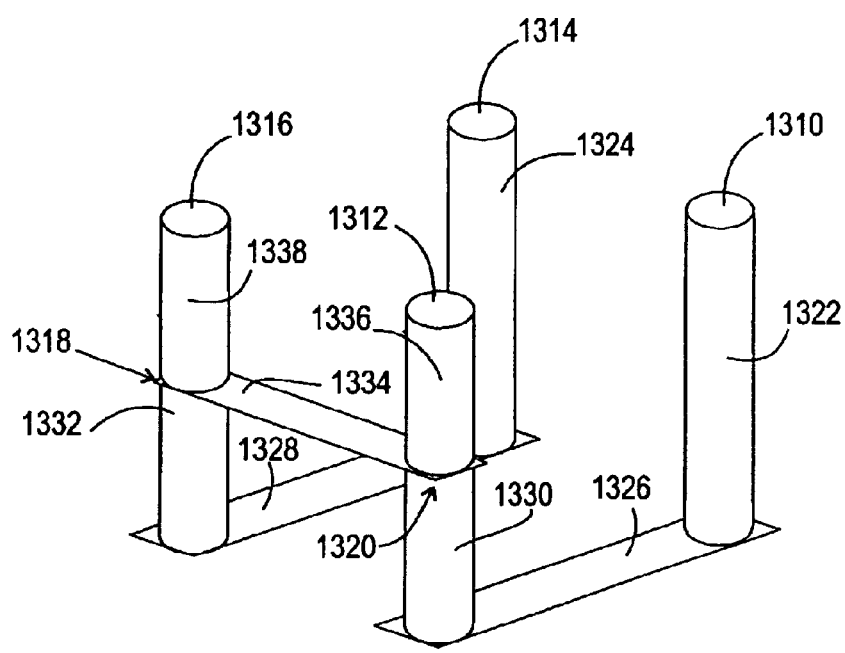
FIG. 30 is a diagram illustrating an example of how the inductors shown in FIG. 29 could be formed in a ceramic chip carrier.

FIGS. 29 and 30 illustrate one embodiment of vertically-formed inductors of the present invention. FIG. 29 is an electrical schematic diagram showing inductors L7, L8, L9, L10, and L11 connected between connection points 1310, 1312, 1314, and 1316. As shown, inductors L7 and L8 are connected between connection points 1310 and 1312. Similarly, inductors L9 and L10 are connected between connection points 1314 and 1316. Inductor L11 is connected between connection points 1318 and 1320, which are formed between inductors L9 and L10, and L7 and L8.

FIG. 30 illustrates an example of how the circuit of FIG. 29 can be implemented using vertically-formed inductors of the present invention. The connection points 1310, 1312, 1314, and 1316 are formed at the surface of the ceramic chip carrier (not shown in FIG. 30) and will be electrically connected to four of the bumps 974 of the flip-chip 970. In this example, the inductors are formed using the upper two layers of the ceramic chip carrier. Vias 1322 and 1324 extend through both layers where they are connected to an end of conductive traces 1326 and 1328, respectively, formed in the lower layer of the ceramic chip carrier. The opposite ends of the conductive traces 1326 and 1328 are connected to vias 1330 and 1332, respectively, which are also formed in the lower layer of the ceramic chip carrier. Together, the via 1322, conductive trace 1326, and via 1330 form inductor L7. Similarly, the via 1324, conductive trace 1328, and via 1332 form inductor L9. The vias 1330 and 1332 are connected to opposite ends of conductive trace 1334, formed in the upper layer. The conductive trace 1334 forms the inductor L11. Finally, vias 1336 and 1338 are connected to the vias 1330 and 1332, respectively, as well as to opposite ends of the conductive trace 1334. The vias 1336 and 1338 form the inductors L8 and L10, respectively. While FIGS. 29 and 30 show one specific example of how inductors could be formed in the ceramic chip carrier, it should be understood that other implementations are possible.

Another benefit of the present invention relates to sensing the output power of an RF power amplifier for purposes of controlling the output power. As mentioned above, in some devices (e.g., cellular telephones or other wireless communication devices), there is a need to sense the power delivered to the antenna of a device so that the output power of the device can be precisely controlled.

Figure 31:
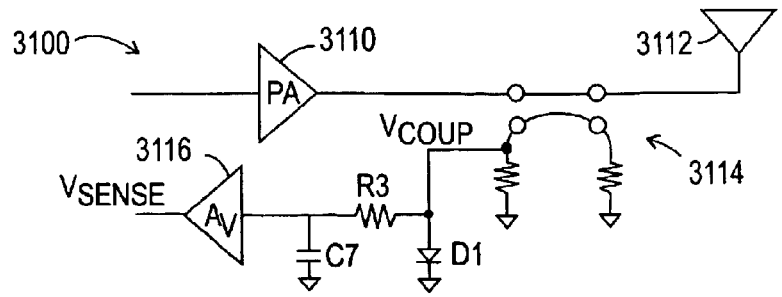
FIG. 31 is a schematic diagram of a prior art power detector.

FIG. 31 illustrates a prior art approach for detecting the output power of a power amplifier. FIG. 31 shows a circuit 3100 including a power amplifier 3110 and an antenna 3112 coupled to the output of the power amplifier 3110. A directional coupler 3114 is coupled to sense the output power of the power amplifier 3110. The directional coupler 3114 generates a signal $V_{COUP}$ that is rectified by a Schotkey diode D1 and then filtered by the RC filter (comprised of resistor R3 and capacitor C7). The rectified and filtered signal is provided as an input to a linear amplifier 3116. The amplifier 3116 generates a DC signal $V_{SENSE}$ which may be used to control the output power of the power amplifier 3110. The level of $V_{SENSE}$ provides an indication of the amount of power provided to the antenna 3112. Generally, as the output power of the power amplifier 3110 increases, the voltage of $V_{SENSE}$ also increases.

Figure 32:
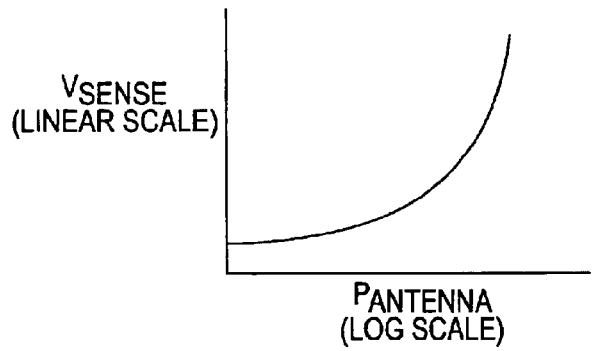
FIG. 32 is a plot illustrating $V_{SENSE}$ as a function of the output power of the amplifier shown in FIG. 31.

FIG. 32 is a plot of a curve illustrating $V_{SENSE}$ as a function of the output power ($P_{ANTENNA}$) of the power amplifier 3110. As shown, the curve is not linear, which can cause problems. The non-linear $V_{SENSE}$ curve requires that each device produced (e.g., each cell phone) be calibrated at various power levels. This takes time and increases the ultimate cost of the device. Another problem with this prior art approach is that the circuitry is not accurate, especially at lower power levels. In addition, the temperature sensitivity of the Schotkey diode D1 effects the accuracy of the circuitry.

Figure 33:
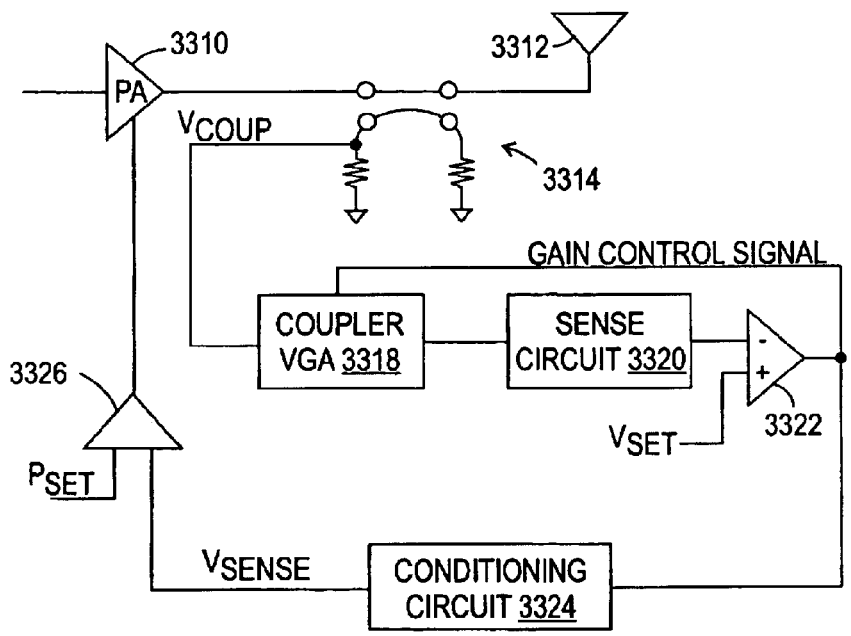
FIG. 33 is a block diagram of a circuit for controlling the output power of an RF power amplifier.
Figure 34:
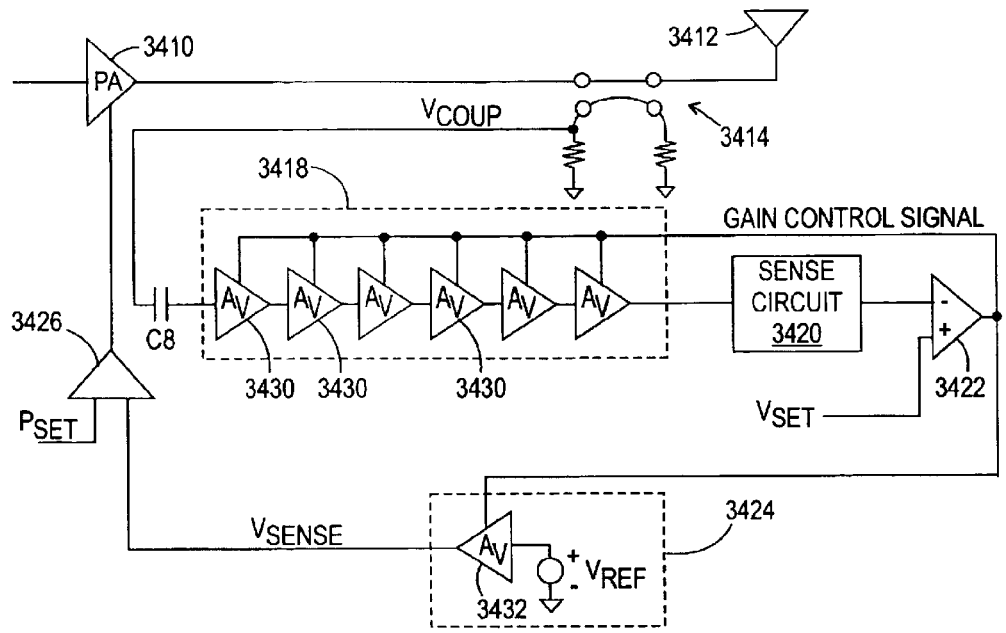
FIGS. 34 and 35 illustrate examples of circuitry for sensing and controlling the output power of an RF power amplifier.
Figure 35:
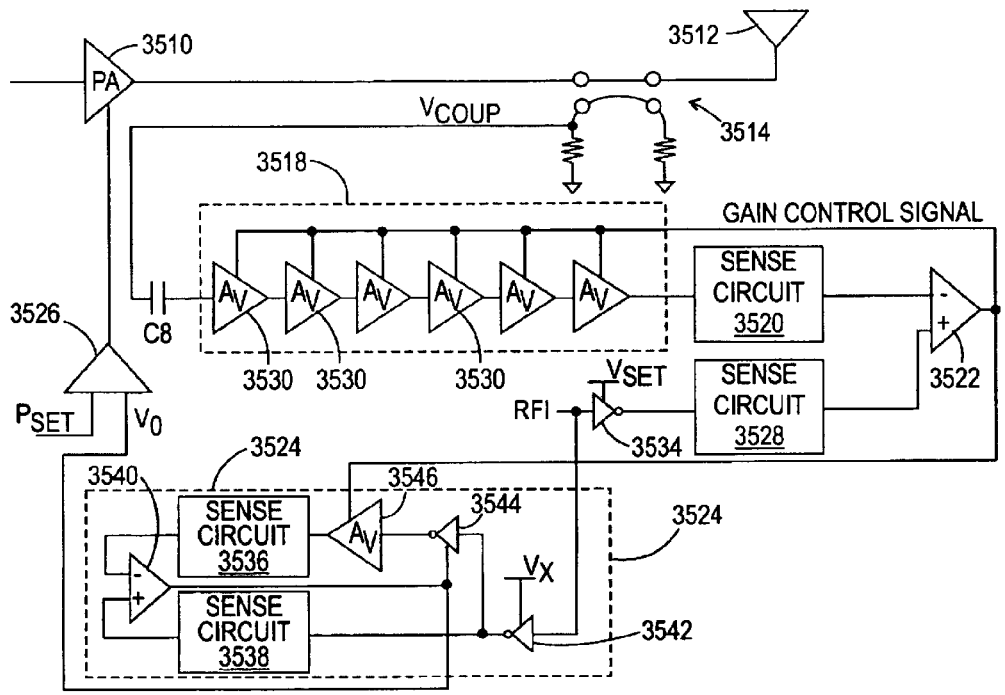

The present invention provides a solution to the problems found in the prior art by approximating a linear $V_{SENSE}$ curve on a power log scale. FIG. 33 is a block diagram of a circuit for controlling the output power of an RF power amplifier. FIG. 33 shows a power amplifier 3310 and an antenna 3312 coupled to the output of the power amplifier 3310. A power detector (shown in FIG. 33 as directional coupler 3314) is coupled to the output of the power amplifier 3310 for sensing the output power of the power amplifier 3310. Other examples of power detectors are described below with respect to FIGS. 38–42. The directional coupler 3314 generates a detector output signal $V_{COUP}$ which is proportional to the output power of the power amplifier 3310. The signal $V_{COUP}$ is provided to a coupler variable gain amplifier (coupler VGA) 3318. Some examples of suitable coupler VGAs are described below. The amplified output of the coupler VGA 3318 is provided to the input of a sense circuit 3320. The sense circuit 3320 may be provided by any circuitry that responds to the envelope the carrier signal. Examples of circuitry suitable for use as sense circuits include, but are not limited to, peak detectors, RMS detector, rectifiers, etc. The output of the sense circuit 3320 is provided to a first input of an op amp 3322. A second input of the op amp 3322 is coupled to a reference voltage ($V_{SET}$). Note that "$V_{SET}$" referred to with respect to FIGS. 33–35 is a different signal than "VSET" referred to with respect to the earlier figures. The op amp 3322 generates a gain control signal which is fed back to the coupler VGA 3318 for controlling the gain of the coupler VGA 3318. The gain control signal is also provided to a conditioning circuit 3324 which conditions the gain control signal and generates a DC signal $V_{SENSE}$. As the output power sensed by the directional coupler 3314 increases, the value of the signal $V_{SENSE}$ will decrease. The signal $V_{SENSE}$ is provided to control circuitry 3326. The control circuitry 3326 is also provided with a signal $P_{SET}$ which relates to a desired output power level of the power amplifier 3310. The output of control circuitry 3326 is provided to the power amplifier 3310 to control the output power of the amplifier 3310. The circuit shown in FIG. 33 functions to maintain the output power of the power amplifier 3310 at a desired level by sensing the actual output power and adjusting the gain of the power amplifier 3310 accordingly. The gain of the power amplifier 3310 is controlled based on the generated signal $V_{SENSE}$ and the value of $P_{SET}$. The circuit illustrated in FIG. 33 (as well as the circuits described below) are designed to approximate logarithmic amplifiers.

FIGS. 34 and 35 illustrate examples of block diagrams of circuitry for sensing and controlling the output power of an RF power amplifier. FIG. 34 shows a power amplifier 3410 and an antenna 3412 coupled to the output of the power amplifier 3410. A directional coupler 3414 is coupled to the output of the power amplifier 3410 for sensing the output power of the power amplifier 3410. The directional coupler 3414 generates a signal $V_{COUP}$ which is proportional to the output power of the power amplifier 3410. The signal $V_{COUP}$ is provided to a coupler VGA 3418. An optional capacitor C8 is coupled between the directional coupler 3414 and the coupler VGA 3418 to provide a DC block. The coupler VGA 3418 illustrated in FIG. 34 is comprised of a multi-stage amplifier. In the example shown in FIG. 34, the coupler VGA 3418 is comprised of six linear variable gain amplifier stages 3430. The output of the coupler VGA 3418 is rectified by a sense circuit 3420. The filtered and rectified signal is provided to a first input to of op amp 3422. A fixed-amplitude DC reference voltage ($V_{REF}$) is provided to a second input of the op amp 3422. The value of $V_{SET}$ is the voltage that is desired at the output of the sense circuit 3420. The op amp 3422 generates a gain control signal based on the inputs to the op amp. The gain control signal is coupled to each amplifier stage 3430 of the coupler VGA 3418 and controls the gain of each stage 3430. The gain control signal is also coupled to a conditioning circuit 3424 which generates a DC signal $V_{SENSE}$ which is provided to control circuitry 3426. The conditioning circuit 3424 conditions the gain control signal to compensate for the non-linearity of the VGA 3418. The conditioning circuit 3424 shown in FIG. 34 is comprised of an amplifier 3432 and a DC voltage source that provides an input voltage $V_{REF}$.

In the scheme illustrated in FIG. 34, $$V_{SENSE} = A_V \cdot V_{REF} \quad (1),$$

where $A_V$ is the gain of each stage 3430 of the coupler VGA 3418 and is also a function of the gain control signal. Also, $$V_{SET} = A_V^n \cdot V_{COUP}(\text{Peak-Peak}) \quad (2),$$

where n is the number of stages 3430 of the coupler VGA 3418. Note that equation (2) depends on the implementation used (i.e., whether the sense circuit 3420 is comprised of a level detector, an RMS detector, etc.). Solving for $V_{SENSE}$ gives $$V_{SENSE} = A_V \cdot V_{REF} = V_{REF} \cdot \sqrt[n]{\frac{V_{SET}}{V_{COUP}(\text{Peak} - \text{Peak})}} \quad (3)$$

Figure 36:
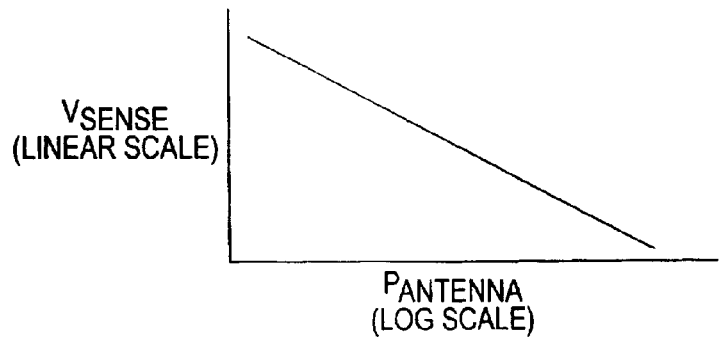
FIG. 36 is a plot illustrating $V_{SENSE}$ as a function of the output power of the amplifier shown in FIG. 33.
Figure 37:
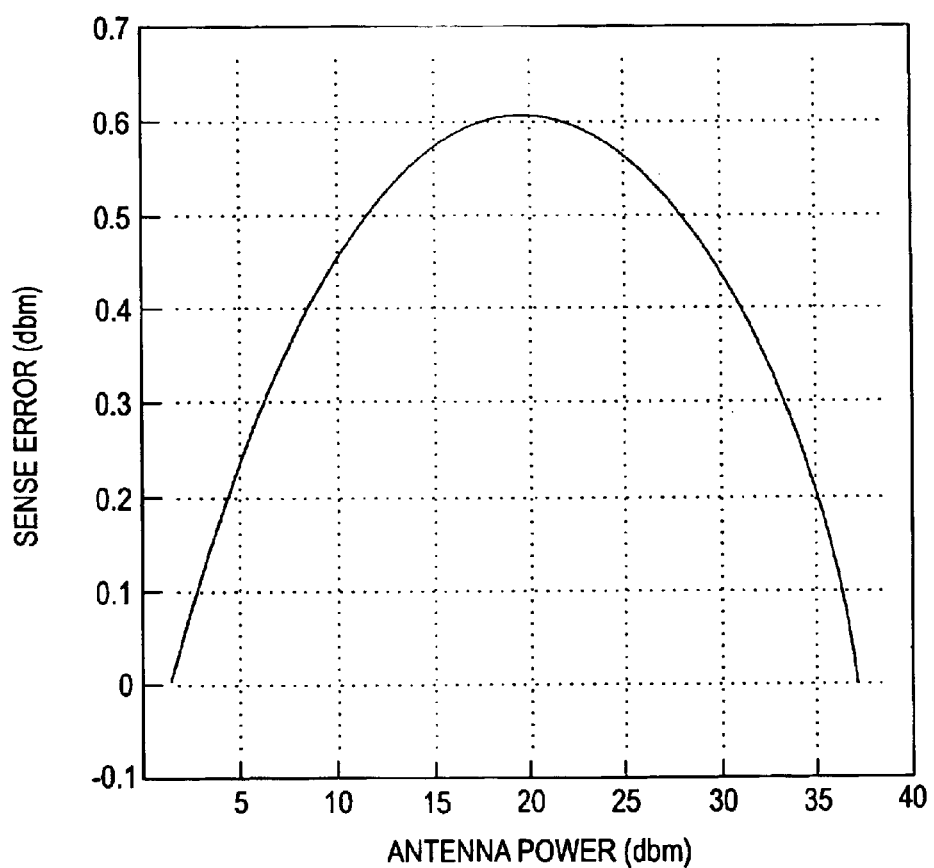
FIG. 37 is a plot illustrating the sense error for the circuitry shown in FIG. 34 at various output levels.

FIG. 36 is a plot of $V_{SENSE}$ versus $P_{ANTENNA}$ (the output power of the power amplifier 3410), with six stages 3430. As shown, the $V_{SENSE}$ curve is fairly linear on a log scale. As the number of amplifier stages 3430 increases, the curve will become more linear. Therefore, for any specific application, the number of stages 3430 used is determined not only by the gain required, but also by the desired linearity (i.e., by the acceptable error level). In one example of a coupler VGA having six stages (e.g., the circuit in FIG. 34) where the amplifier is calibrated at minimum and maximum power levels, the error found is plotted in FIG. 37. As shown, the maximum error is approximately 0.6 dbm. In the example of the specification for GSM devices, the acceptable error level is ±2 dbm. Therefore, in this example, a 0.6 dbm error would be acceptable. If a smaller maximum error is required, more stages 3430 can be added to the coupler VGA 3418. Similarly, if a larger error can be tolerated, fewer stages 3430 can be used in the coupler VGA 3418.

One advantage of the present invention is that a 2 point power calibration is possible, as opposed to calibrating a various power levels. Another advantage is that an acceptable accuracy is achieved at lower power levels. Another advantage is that the system is stable independent of ambient temperature variations. This temperature stability results from the feedback loop. Since the error curve for a device is known, another advantage of the present invention is that a simple lookup table can be used to reduce the error even further. The lookup table may be generated based on the transfer function of the curve illustrated in FIG. 37.

FIG. 35 is a block diagram of a circuit similar to the circuit shown in FIG. 34. Unlike the circuit shown in FIG. 34, the circuit shown in FIG. 35 uses an AC reference tone and a second sense circuit to provide the second input to an op amp. By using the reference tone and the second sense circuit, simpler circuitry can be used for the sense circuitry (described below). Like FIG. 34, FIG. 35 shows a power amplifier 3510 coupled to an antenna 3512 and a directional coupler 3514 coupled to the output of the power amplifier 3510 for generating a signal $V_{COUP}$. The signal $V_{COUP}$ is provided to a coupler VGA 3518. The output of the coupler VGA 3518 is rectified and filtered by a sense circuit 3520. The filtered and rectified signal is provided to a first input of op amp 3522. An AC reference tone RFI is provided to a variable limiter 3534 which limits the peak voltage to the value of $V_{SET}$. The output of the variable limiter 3534 is rectified and filtered by the sense circuit 3528 and is provided to a second input of the op amp 3522. The op amp 3522 generates a gain control signal based on the inputs to the op amp. The gain control signal is coupled to each amplifier stage 3530 of the coupler VGA 3518 and controls the gain of each stage 3530. The gain control signal is also coupled to a conditioning circuit 3524 which generates a DC signal $V_O$.

The conditioning circuit 3524 includes first and second sense circuits 3536 and 3538 which each provide an input to an op amp 3540. The output of the op amp 3540 provides a signal $V_O$ to the control circuitry 3526 for controlling the output of the power amplifier 3510. At one input to the conditioning circuit 3524, the AC reference tone RFI is provided to a limiting amplifier 3542 which is powered by a voltage $V_X$ resulting in an AC signal with a known amplitude ($V_X$). The output of the limiting amplifier 3542 is provided to the second sense circuit 3538 and to an inverter 3544. The inverter 3544 is powered by the output ($V_O$) of the op amp 3540, resulting in an AC signal with an amplitude of $V_O$. The output of the inverter 3544 is coupled to the input of a VGA 3546. The gain of the VGA 3546, like the gain of the VGA stages 3530, is controlled by the gain control signal from the op amp 3522. The output of the VGA 3546 is coupled to the input of the first sense circuit 3536. The conditioning circuit 3524 compensates for the non-linearity of the VGA 3518. Note that, like the sense circuits 3520 and 3528, the sense circuits 3536 and 3538 may be matched to improve the performance of the invention. The signal $V_O$ has a function similar to the signal $V_{SENSE}$ in FIG. 34. The control circuitry 3526 uses $V_O$ and $P_{SET}$ to set the output power of the power amplifier 3510 to a desired level. In the circuit shown in FIG. 35, $$V_O = \frac{V_X}{A_V}. \quad (4)$$

Note that while $V_{SENSE}$ (FIG. 34) is proportional to $A_V$, $V_O$ (FIG. 35) is proportional to $1/A_V$. This is an advantage as the signal $V_O$ increases as the RF power delivered to the load increases. Note that because of the differences between $V_{SENSE}$ and $V_O$, the control circuitry 3426 and 3526 have to be designed accordingly.

Yet another advantage to the present invention is that the sense circuitry can be implemented with simple peak detectors or RMS detectors that match each other, but do not require absolute accuracy. The temperature stability of the circuits shown in the Figures can be improved by matching the sense circuits. At high frequencies, especially in CMOS, it is difficult to build sense circuits that are accurate. In the circuit shown in FIG. 35, the sense circuits 3520 and 3528 are matched to enhance temperature stability. In addition, the output of the sense circuit 3520 is compared to the reference voltage $V_{SET}$ (via sense circuit 3428). The reference tone RFI may be provided from an existing signal in the device. For example, RFI could come from the transmit signal of the power amplifier prior to final stage amplification.

FIGS. 34 and 35 provide two examples of suitable conditioning circuits. Many types of conditioning circuits could be used within the spirit and scope of the present invention. For example, in the case where the coupler VGA is simply a linear variable gain amplifier, then the conditioning circuit may be comprised of a linear device (e.g., a wire or a simple gain circuit). In another example, where the coupler VGA has a non-linear function (i.e., the gain is a non-linear function of $V_{COUP}$), the conditioning circuit may be complicated (e.g., the conditioning circuit 3524 shown in FIG. 35). Therefore, it is evident that there are a variety of ways that a conditioning circuit could be designed.

In one embodiment of the present invention, the power amplifier (3310, 3410, 3510) and the coupler VGA (3318, 3418, 3518) are formed on a single integrated circuit. The power amplifier and coupler VGA may also be packaged using the packaging techniques described above (see FIGS. 25–26). For example, a "flip chip" integrated circuit may be mounted to a multi-layer ceramic chip carrier. In one example, all of the components shown in FIGS. 33, 34, or 35 except the directional coupler are formed on an integrated circuit with the directional coupler formed separately, such as on a ceramic chip carrier.

Another benefit of the present invention relates to accurately detecting the output power of a power amplifier. One method of detecting the output power of a power amplifier is to use a directional coupler (e.g., see FIGS. 33–35, described above). A typical directional coupler measures the load impedance through the reflection coefficient. Once the load impedance is known, a voltage measurement can be used to measure the power. In essence, the directional coupler is measuring the voltage and current signals simultaneously at the coupled port ($I_C$) and isolated port ($I_I$), as illustrated in the following equations, $$I_C = I + Z_0 \times V \qquad (5), \text{ and}$$

$$I_I = I - Z_0 \times V \qquad (6), \text{ and}$$

which can be solved for both I and V. However, typically, directional couplers are used in a different way in most applications of power amplifiers. Instead of measuring the power in both the coupled and isolated ports, a single measurement is made at the coupled port. Measuring the coupled power alone is not sufficient to calculate the power to the load. However, in practice, the error in doing so is tolerable. For example, it can be shown that a 4:1 load voltage-standing wave ratio (VSWR) produces close to 2 dB of error in the power measurement, which is better than a 6 dB error that would result in measuring the voltage or current alone. In practice, the 2 dB error results from using a directional coupler with a very high directivity (a ratio of the coupled power to the isolated power). A typical low-cost low-insertion loss directional coupler may have only 10 dB of directivity. Therefore, the error in using such a directional coupler can be as large as 3.5 dB.

The present invention provides a new power measurement technique as an alternative to directional couplers, which are bulky, expensive, and lossy. In general, the present invention provides a power measurement technique that is based on the absolute values, or magnitudes, of the voltage and current at the load. By sensing the magnitudes of the voltage and current, the output power can be determined. The phase difference of the voltage and current can be neglected, as described below.

With a known load impedance, power detection is simpler, since for a known impedance, only the voltage or current magnitude needs to be measured. However, ideally, when the impedance of a load is not known, the voltage, current, and phase information at the output of the power amplifier needs to be detected. In an ideal case, the output power at the load is determined using the following equation, $$P = I \times V \times \cos(\theta) \qquad (7),$$

where I and V are the magnitudes of the current and voltage and $\theta$ is the phase difference between the current and the voltage. The present invention ignores the phase information and uses only the magnitudes of the current and voltage. However, the resulting error is no worse that errors associated with typical directional couplers.

FIG. 38 is a diagram of a circuit for detecting the output power of a power amplifier. In general terms, the circuit shown in FIG. 38 senses the output voltage and current of the power amplifier and generates an output signal that is proportional to the output power of the power amplifier. FIG. 38 shows a power amplifier 3810 coupled to an antenna 3812. A voltage sensor 3850 and a current sensor 3852 are coupled to the output of the power amplifier 3810 for sensing the voltage and current at the output. The voltage sensor 3850 and current sensor 3852 are each connected to inputs of a mixer 3854. The mixer 3854 mixes the sensed voltage and current to provide an RF signal to its output that is related to the product of the sensed voltage and current. The output of the mixer 3854 is connected to an input of a low pass filter 3856. The low pass filter 3856 demodulates the RF signal to a DC output signal 3864 that is proportional to the output power of the power amplifier 3810 and can be used by the power amplifier for power control functions (described above).

The voltage and current can be sensed using various techniques, including the examples described below. The functions of the mixer 3854 and low pass filter 3856 can also be realized using various different techniques. For example, the mixer could be comprised of a Gilbert Cell mixer, a diode mixer, or any other suitable circuit. In other examples, the functions of the mixer 3854 and low pass filter 3856 are provided using logarithmic or pseudo-logarithmic amplifiers (described in detail below).

FIG. 39 is a diagram of one example of a circuit for detecting the output power of a power amplifier. Like FIG. 38, FIG. 39 shows a power amplifier 3810, antenna 3812, voltage sensor 3850, and current sensor 3852. The voltage sensor 3850 is connected to an envelope detector 3851, which essentially detects the magnitude of the output of the voltage sensor. The envelope detector 3851 could be comprised of a peak detector, an RMS detector, or any other type of magnitude or absolute value detector. Similarly, the current sensor 3852 is connected to an envelope detector 3853. The outputs of the envelope detectors 3851 and 3853 provide signals related to the magnitude of the sensed voltage and current, without the phase information. The outputs of the envelope detectors 3851 and 3853 are connected to the a mixer 3854, which mixes the signals together to provide output signal 3864.

In FIGS. 38 and 39, the voltage sensor 3850 is connected to the output of the power amplifier 3810 after the current sensor 3852 (i.e., connected between the current sensor 3852 and the antenna 3812). FIG. 40 shows an example where the voltage sensor 3850 is connected between the power amplifier 3810 and the current sensor 3852. To improve the accuracy of such an arrangement, a series impedance element $Z_S$ is connected in-line with the current sensor 3852 as shown. Ideally, the sum of the values of the impedance element $Z_S$ and the impedance of the current sensor 3852 should be as close to zero as is practical. For example, If the current sensor 3852 includes an inductor connected in-line with the output of the power amplifier 3810, then a suitable impedance element for $Z_S$ would be a capacitor, sized to tune out the inductor at the operating frequency. If the sum impedance is close to zero, a more accurate voltage measurement can be obtained.

FIG. 41 is a diagram of another example of a circuit for detecting the output power of a power amplifier. FIG. 41 is similar to FIG. 39, but with the mixer 3854 replaced by first and second DC logarithmic amplifiers 3857 and 3859, and a summing element 3862. The outputs of the envelope detectors 3851 and 3853 are connected to inputs of the DC logarithmic amplifiers 3857 and 3859. The outputs of the DC logarithmic amplifiers 3857 and 3859 are summed together by summing element 3862 to provide an output signal 3864 equal to the log of the sensed voltage times current.

FIG. 42 is a diagram of another example of a circuit for detecting the output power of a power amplifier. FIG. 42 is similar to FIG. 41, with the envelope detectors and DC logarithmic amplifiers replaced by RF logarithmic amplifiers 3858 and 3860. The RF logarithmic amplifiers 3858 and 3860 are each comprised of amplifiers that function as envelope detectors and provide DC outputs, such as the logarithmic amplifiers described above with respect to FIGS. 33–35. The outputs of the RF logarithmic amplifiers 3858 and 3860 are summed together by summing element 3862 to provide an output signal 3864.

FIG. 43 is a diagram showing one example of voltage and current sensors used for detecting the output power of a power amplifier. In FIG. 43, the output voltage of the power amplifier 3810 is sensed through a voltage divider comprised of first and second impedance elements $Z_1$ and $Z_2$ connected between the output of the power amplifier 3810 and ground. Since the phase of the voltage, relative to the phase of the current, will be neglected, any suitable combination of impedances can be used. The impedance elements $Z_1$ and $Z_2$ may be comprised of any desired type of impedance elements (e.g., capacitors, resistors, inductors, etc., or any combination thereof). In one example, impedance elements $Z_1$ and $Z_2$ are comprised of two capacitors. The sizes of the impedance elements $Z_1$ and $Z_2$ can be any desired sizes, although it is desirable to keep the input impedance of the voltage divider large relative to the load impedance of the power amplifier 3810. The node formed between impedance elements $Z_1$ and $Z_2$ is connected to the input of a first RF logarithmic amplifier 3858. Also note that the logarithmic amplifiers should have a high input impedance.

In FIG. 43, the output current of the power amplifier 3810 is sensed using first and second inductors L12 and L13. Like FIG. 40, an impedance element $Z_S$ is connected between the output of the power amplifier 3810 and the current sensor. In one example, the inductors L12 and L13 form a weakly coupled transformer loaded by the high input impedance of the RF logarithmic amplifier 3860. Since the current in the secondary transformer (L13) will be approximately zero, the voltage at the secondary is approximately equal to the current in the primary times the mutual inductance of the coils times the angular frequency of operation, phase shifted by 90 degrees. The voltage detected, therefore, is proportional to the current of the load. The phase information, though is 90 degrees off. In one example, the inductor L12 is comprised of an existing inductor in the power amplifier 3810. For example, L12 could be comprised of an inductor used by the power amplifier for filtering or impedance matching (e.g., inductors L2 or L3 in the Figures).

The RF logarithmic amplifiers 3858 and 3860 receive the sensed voltage and current and generate DC output signals related to the log of the sensed voltage and current The output signals of the RF logarithmic amplifiers 3858 and 3860 are summed together by summing element 3862 to provide an output signal 3864 equal to the log of the sensed voltage times current (i.e., the log of the output power of the power amplifier 3810).

FIG. 44 is a diagram illustrating another technique of sensing the output current of the power amplifier 3810. In place of the inductors L12 and L13, the output current is sensed by detecting the voltage drop across a series impedance element $Z_3$ placed in line with the load. An amplifier 3866 has two inputs connected to the impedance element $Z_3$ and an output connected to the input of the RF logarithmic amplifier 3860. The impedance element could be comprised of any desired impedance element, such as a resistor, capacitor, inductor, etc. In one example, the impedance element $Z_3$ is already a part of the circuit, such as a series inductor or capacitor used to filter the harmonic signals of the power amplifier 3810 (e.g., inductor L2 or capacitor C2 shown in the power amplifier of FIG. 4).

FIG. 45 is a diagram illustrating another technique of sensing the output voltage of the power amplifier 3810. In place of the voltage divider, a direct connection 3868 is provided between the power amplifier output and the input of the RF logarithmic amplifier 3860. In this example, it may be important to ensure that the input impedance of the RF logarithmic amplifier 3860 does not significantly load the power amplifier 3810.

In the examples shown in FIGS. 40 and 43, the voltage is sensed before the current (i.e., the voltage sensor is placed between the power amplifier and the current sensor). If the voltage detector is realized in an integrated circuit , then the arrangement shown in FIGS. 40 and 43 may be the most desirable. If the circuit is realized off an integrated circuit, or on the circuit board, then it may be more desirable to sense the voltage after the current.

Figure 46:
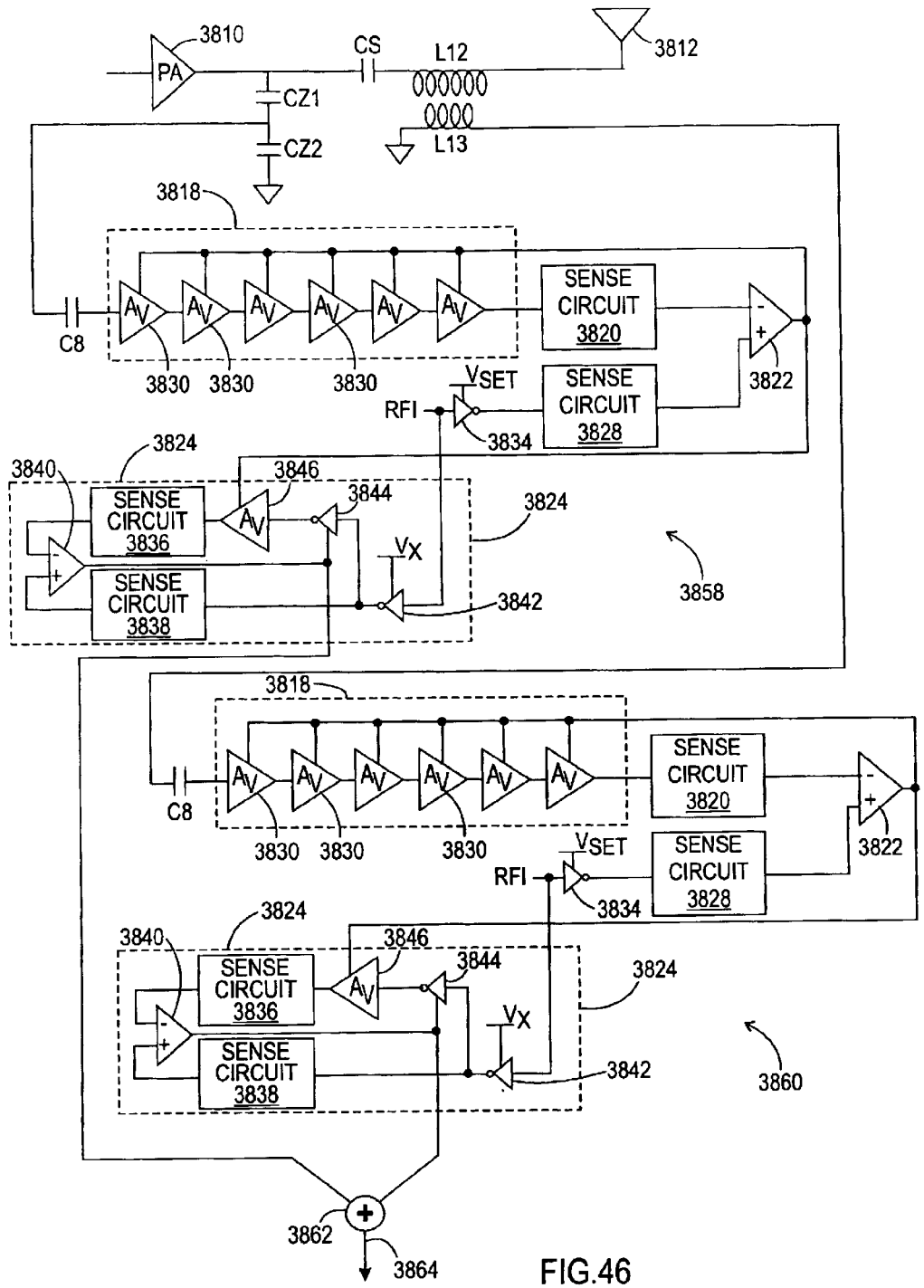

FIG. 46 is a diagram showing one example of RF logarithmic amplifiers 3858 and 3860. The RF logarithmic amplifiers 3858 and 3860 shown in FIG. 46 are each comprised of the same logarithmic amplifiers described above with respect to FIGS. 33–35. If needed, the input ranges of the logarithmic amplifiers should be adjusted to work with the implementation used. A voltage sensor is comprised of a voltage divider formed by capacitors $C_{Z1}$ and $C_{Z2}$. A current sensor is comprised of first and second inductors L12 and L13. A capacitor $C_S$ is connected between the voltage sensor and the current sensor. The voltage sensor is coupled to a first RF logarithmic amplifier 3858, while the current sensor is coupled to a second RF logarithmic amplifier 3860. The outputs of the amplifiers 3858 and 3860 are summed together by summing element 3862 to provide the output signal 3864, which is proportional to the output power of the power amplifier 3810. The functions of RF logarithmic amplifiers 3858 and 3860 and summing element 3862 are to take the product of the voltage and current signals and to reduce the dynamic range of the signals. In effect, the output signal 3864 is generated based on the absolute values of the sensed voltage and current, while ignoring the phase information. The components of the RF logarithmic amplifiers 3858 and 3860 are the same as the similarly numbered components described above and shown in FIG. 35.

One advantage of the power detector described above is that it has almost no insertion loss, compared to the 0.2–0.4 dB insertion loss associated with a typical directional coupler. Another advantage of the power detector of the present invention is that it can be much cheaper than a typical directional coupler, especially when elements used for power detection (e.g., inductor L12 or impedance element Z$_3$, etc.) are already a part of the power amplifier.

The performance of the absolute power detector of the present invention is comparable to that of a typical directional coupler. For example, the performance under a VSWR of 4:1 (with varying real and imaginary parts of the load) is comparable to using a directional coupler of finite directivity (e.g., 10 dB). Under such conditions, the absolute power detector of the present invention has an error no larger than 3.5 dB. In addition, the signal detected is always less than the actual power to the load, similar to a perfect directional coupler (a directional coupler with finite directivity can detect a power larger than the actual power). A detected signal greater than the actual power to the load can cause problems while trying to transmit maximum power in a bad VSWR environment (e.g., a broken antenna). If the absolute power detector is used in a feedback loop, then detecting less power than the actual power is beneficial since it forces the maximum possible power out of the power amplifier in such as scenario. In contrast, detecting more power than the actual power is detrimental since that condition will cause the power amplifier output power to back-off from the maximum power. In some applications, such as in a cell phone application, this can result in a call-drop or the inability to initiate a call far from a base-station, therefore limiting the range of the cell phone.

The absolute power detector of the present invention can be used for any desired use, in addition to power control techniques described above. For example, the invention may be used in other wireless applications that require a low-resolution power measurement. The absolute power detector may also be packaged in any desired manner. For example, the voltage detector could be formed within the power amplifier or reside on or off the integrated circuit containing the power amplifier. Similarly, the current sensor could reside on or off the integrated circuit. If the current sensor is comprised of a transformer (FIG. 39), the current sensor will likely reside on a circuit board or in a chip carrier.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A power detector for detecting the output of a power amplifier comprising:

a voltage sensor coupled to the power amplifier for sensing the voltage provided to the output of the power amplifier;

a first envelope detector coupled to the voltage sensor;

a current sensor coupled to the power amplifier for sensing the current provided to the output of the power amplifier;

a second envelope detector coupled to the current sensor;

a mixer coupled to first and second envelope detectors for generating an output signal from the sensed voltage and sensed current that is related to the output power of the power amplifier.

2. The power detector of claim 1, wherein the voltage sensor is comprised of a voltage divider coupled to the output of the power amplifier.

3. The power detector of claim 2, wherein the voltage divider is comprised of a plurality of elements having an impedance.

4. The power detector of claim 3, wherein the plurality of elements are capacitors.

5. The power detector of claim 1, wherein the voltage sensor is comprised of a direct connection between the output of the power amplifier and the first envelope detector.

6. The power detector of claim 1, wherein the voltage sensor is formed within the power amplifier.

7. The power detector of claim 6, wherein the power amplifier and voltage sensor are formed on a the same integrated circuit.

8. The power detector of claim 1, wherein the current sensor is comprised of first and second mutually coupled inductors.

9. The power detector of claim 8, wherein the first mutually coupled inductor is connected to the output of the power amplifier, and wherein the current is sensed by sensing the induced current in the second inductor.

10. The power detector of claim 8, wherein the first mutually coupled inductor is comprised of a filter inductor of the power amplifier.

11. The power detector of claim 1, wherein the current sensor is comprised of circuitry that senses a voltage drop across an impedance connected between the output of the power amplifier and a load.

12. The power detector of claim 1, wherein the output signal is based on the magnitudes of the sensed voltage and sensed current.

13. The power detector of claim 1, wherein the mixer is further comprised of:

a first logarithmic amplifier coupled to the voltage sensor;

a second logarithmic amplifier coupled to the current sensor; and circuitry for combining outputs of the first and second logarithmic amplifiers to generate the output signal.

14. The power detector of claim 13 wherein the first logarithmic amplifier includes a first variable gain amplifier for amplifying the sensed voltage to a desired level, wherein the value of the output of the first logarithmic amplifier is a function of the gain of the variable gain amplifier.

15. A method of detecting the output power of a power amplifier comprising the steps of:

sensing the magnitude of the voltage at the output of the power amplifier;

sensing the magnitude of the current at the output of the power amplifier; and generating a signal using the sensed output voltage and sensed output current, wherein the generated signal is proportional to the output power of the power amplifier.

16. The method of claim 15, wherein the voltage is sensed by connecting a voltage divider to the output of the power amplifier and sensing a voltage present at a node of the voltage sensor.

17. The method of claim 15, wherein the voltage is directly sensed by measuring the voltage present at the output of the power amplifier.

18. The method of claim 15, wherein the current is sensed using first and second mutually coupled inductors.

19. The method of claim 18, wherein the first inductor is a part of the power amplifier, and wherein the current is sensed by sensing the induced current in the second inductor.

20. The method of claim 15, wherein the current is sensed by detecting the voltage drop across an impedance element placed in line with the output of the power amplifier.

* * * * *

UNITED STATES PATENT AND TRADEMARK OFFICE
CERTIFICATE OF CORRECTION

| | | |
|---|---|---|
| PATENT NO. | : 6,756,849 B2 | Page 1 of 1 |
| APPLICATION NO. | : 10/673749 | |
| DATED | : June 29, 2004 | |
| INVENTOR(S) | : Dupuis et al. | |

It is certified that error appears in the above-identified patent and that said Letters Patent is hereby corrected as shown below:

In the Specification

<u>COL. 1, Line 6</u>:
DELETE: "This application is"

ADD: --This application is a continuation of Serial No. 10/097,162, entitled "ABSOLUTE POWER DETECTOR" by Timothy J. Dupuis et al., filed on March 13, 2002, which is--

Signed and Sealed this
Eighth Day of July, 2014

Michelle K. Lee
*Deputy Director of the United States Patent and Trademark Office*